US011978516B2

(12) United States Patent
Wang et al.

(10) Patent No.: US 11,978,516 B2
(45) Date of Patent: May 7, 2024

(54) DYNAMIC SENSE AMPLIFIER SUPPLY VOLTAGE FOR POWER AND DIE SIZE REDUCTION

(71) Applicant: SanDisk Technologies LLC, Addison, TX (US)

(72) Inventors: Yanjie Wang, Santa Clara, CA (US); Ohwon Kwon, Pleasanton, CA (US); Kou Tei, San Jose, CA (US); Tai-Yuan Tseng, Milpitas, CA (US); Yasue Yamamoto, Fujisawa (JP); Yonggang Wu, San Jose, CA (US); Guirong Liang, Santa Clara, CA (US)

(73) Assignee: SanDisk Technologies LLC, Austin, TX (US)

( * ) Notice: Subject to any disclaimer, the term of this patent is extended or adjusted under 35 U.S.C. 154(b) by 213 days.

(21) Appl. No.: 17/718,124

(22) Filed: Apr. 11, 2022

(65) Prior Publication Data

US 2023/0326531 A1    Oct. 12, 2023

(51) Int. Cl.
*G11C 16/04* (2006.01)
*G11C 16/08* (2006.01)
(Continued)

(52) U.S. Cl.
CPC .......... *G11C 16/26* (2013.01); *G11C 16/0483* (2013.01); *G11C 16/08* (2013.01); *G11C 16/16* (2013.01); *G11C 16/24* (2013.01); *G11C 16/30* (2013.01); *G11C 16/3459* (2013.01); *H01L 24/08* (2013.01); *H01L 24/16* (2013.01); *H01L 24/48* (2013.01); *H01L 25/0657* (2013.01); *H01L 2224/08148* (2013.01); *H01L 2224/16225* (2013.01); *H01L 2224/48149* (2013.01); *H01L 2224/48229* (2013.01); *H01L 2225/06506* (2013.01); *H01L 2225/0651* (2013.01); *H01L 2225/06517* (2013.01);
(Continued)

(58) Field of Classification Search
CPC ........ G11C 16/26; G11C 16/08; G11C 16/16; G11C 16/24; G11C 16/20; G11C 16/0483
See application file for complete search history.

(56) References Cited

U.S. PATENT DOCUMENTS 7,551,477 B2    6/2009   Mokhlesi et al.
8,649,223 B2*   2/2014   Maeda ................... G11C 16/26
                                                    365/185.24
(Continued)

*Primary Examiner* — Pho M Luu
(74) *Attorney, Agent, or Firm* — Vierra Magen Marcus LLP

(57) ABSTRACT

A memory system having a dynamic supply voltage to sense amplifiers. The supply voltage has a higher magnitude when charging inhibited bit lines during a program operation and a lower magnitude when verifying/sensing memory cells. Reducing the magnitude of the supply voltage saves power and/or current. However, if the lower magnitude were used when the inhibited bit lines are charged during the program operations, some of the memory cells that should be inhibited from programming might experience at least some programming. Using the higher magnitude supply voltage during bit line charging of the program operation assures that the inhibited bit lines are charged to a sufficient voltage to keep drain side select gates of NAND strings off so that the NAND channel will boost properly to inhibit programming of such memory cells.

20 Claims, 15 Drawing Sheets

(51) Int. Cl.
  *G11C 16/16*    (2006.01)
  *G11C 16/24*    (2006.01)
  *G11C 16/26*    (2006.01)
  *G11C 16/30*    (2006.01)
  *G11C 16/34*    (2006.01)
  *H01L 23/00*    (2006.01)
  *H01L 25/065*   (2023.01)

(52) U.S. Cl.
  CPC ........... *H01L 2225/06524* (2013.01); *H01L 2225/06541* (2013.01); *H01L 2225/06562* (2013.01)

(56) References Cited

U.S. PATENT DOCUMENTS

| | | |
|---|---|---|
| 8,971,141 B2 | 3/2015 | Mui et al. |
| 8,995,211 B2 | 3/2015 | Lee |
| 9,001,588 B2 | 4/2015 | Kim et al. |
| 9,013,928 B1 | 4/2015 | Dutta et al. |
| 9,042,183 B2 | 5/2015 | Kamata et al. |
| 9,368,222 B2 | 6/2016 | Dunga et al. |
| 9,558,836 B2 | 1/2017 | Mui et al. |
| 10,957,394 B1 | 3/2021 | Chen et al. |
| 10,971,209 B1 | 4/2021 | Kwon et al. |
| 11,081,167 B1 | 8/2021 | Yabe et al. |
| 2014/0233320 A1* | 8/2014 | Sakaguchi ............ G11C 16/10 365/185.21 |
| 2023/0420058 A1* | 12/2023 | Lee ........................ G11C 16/26 |

\* cited by examiner

DYNAMIC SENSE AMPLIFIER SUPPLY VOLTAGE FOR POWER AND DIE SIZE REDUCTION

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

The memory structure in the memory system typically contains an array that has two sets of conductive lines and non-volatile memory cells. One set of conductive lines are typically referred to as word lines, and the other set of conductive lines are typically referred to as bit lines. Each non-volatile memory cell is associated with one of the word lines and one of the bit lines. For example, for NAND memory a string of memory cells are connected in series to form a NAND string. The NAND string has a drain side select gate at one end and a source side select gate at the other end. The select gates each comprise one or more transistors. Each NAND string is associated with a bit line. The drain side select gate is used to connect/disconnect the channel of the NAND string to/from the bit line. The source side select gate is used to connect/disconnect the channel of the NAND string to/from a source line that is common to many NAND strings. Each memory cell of the NAND string is associated with a different word line. For example, the control gate of a NAND memory cell is connected to a word line. Typically, a word line connects to the control gates of memory cells on many NAND strings.

The memory system typically contains a large number of sense amplifiers. Each bit line is typically associated with a sense amplifier, which is able to sense a state of a selected memory cell on a NAND string. The sense amplifiers typically contain a number of transistors with at least one of the transistors receiving a supply voltage. For example, one or more MOSFETs in the sense amplifier could receive a supply voltage to their respective drains. The sense amplifiers can also be used to control the voltage on the bit lines. For example, a sense amplifier can be used to charge a bit line to a target voltage. The amount of current and/or power that is drawn by the sense amplifies can be a large percentage of the overall current/power draw of the memory system.

BRIEF DESCRIPTION OF THE DRAWINGS

Like-numbered elements refer to common components in the different figures.

DETAILED DESCRIPTION

Figure 1:
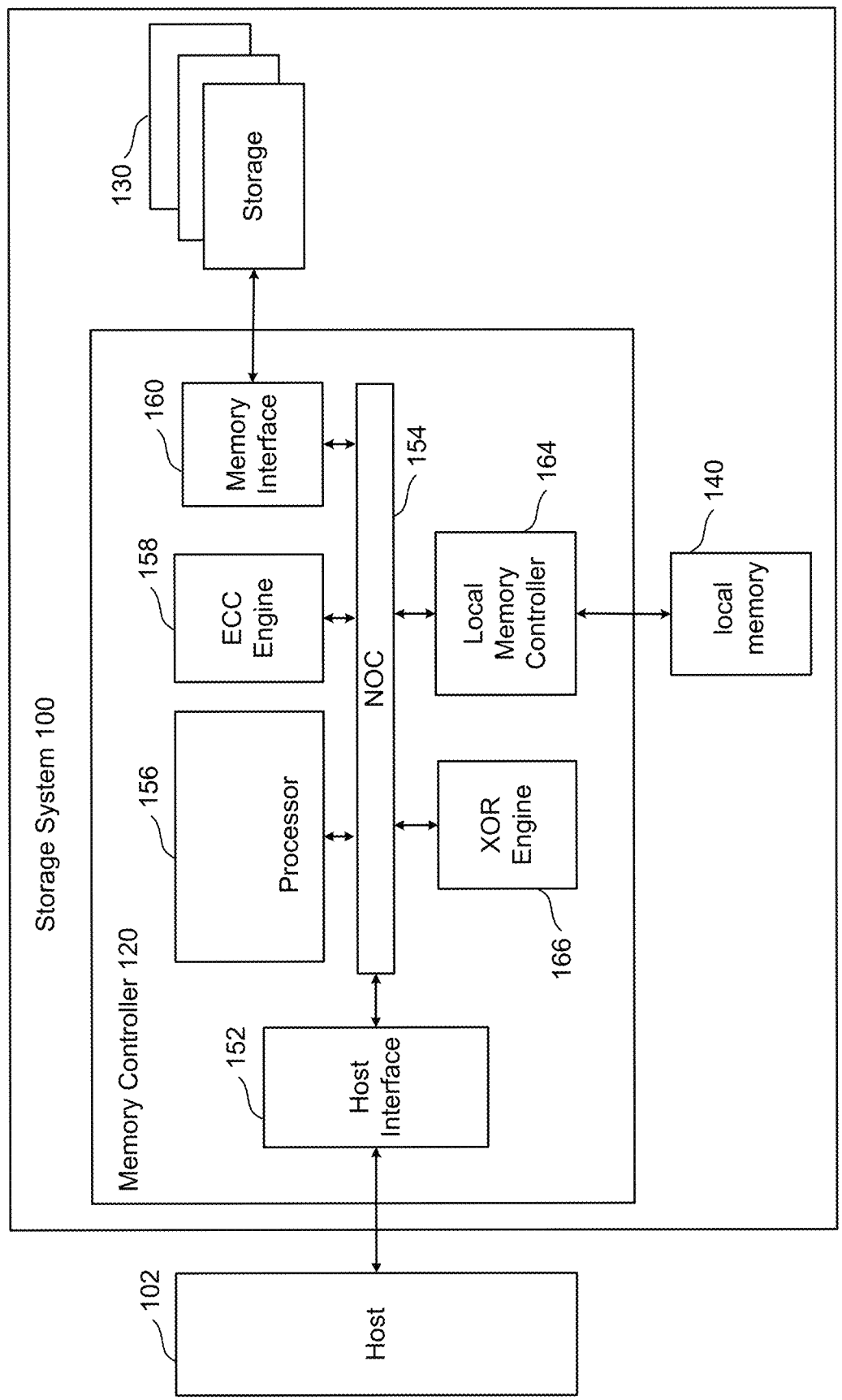
FIG. 1 is a block diagram depicting one embodiment of a storage system.

Technology is disclosed herein for a memory system having a dynamic supply voltage to sense amplifiers. In an embodiment, the supply voltage has a first magnitude when charging inhibited bit lines during a program operation and a second magnitude when verifying memory cells, wherein the second magnitude is less than the first magnitude. Reducing the magnitude of the supply voltage saves power and/or current. However, if the lower magnitude supply voltage were used when the bit lines are charged during the program operations, some of the memory cells that should be inhibited from programming might experience at least some programming. Using the higher magnitude supply voltage during bit line charging of the program operation assures that the inhibited bit lines are charged to a sufficient voltage to keep drain side select gates of NAND strings off so that the NAND channel will boost properly to inhibit programming of such memory cells. Note that the reduced magnitude supply voltage can be used during both verify and read operations.

In some embodiments, the sense amplifier has a bit line voltage control circuit that controls the voltage on the bit line. In some embodiments, the bit line voltage control circuit has a bit line clamp transistor that can be operated in a pass-gate mode to pass the supply voltage to the bit line and a source-follower mode in which the bit line clamp transistor clamps the voltage on the bit line at a sensing voltage. In one embodiment, the higher magnitude supply voltage is used for the pass-gate mode and the lower magnitude supply voltage is used for the source-follower mode. The term "bit line clamp transistor," as used throughout this document, means a transistor that can be operated in a mode (e.g., source-follower mode) in which it clamps a bit line voltage at a target voltage. The bit line clamp transistor can be operated in a mode other than the mode in which it clamps a bit line voltage at a target voltage, such the aforementioned pass-gate mode.

The term "supply voltage" as used herein refers to a voltage that supplies an operating voltage to a transistor. Depending on the type of transistor the supply voltage may be applied to a drain, source, collector, or emitter. Such supply voltages are commonly given names such as Vdd, Vss, Vcc, or Vee. Herein, the term "VDDSA" may be used without limitation to the type of transistor (e.g., FET, BJT) or terminal (e.g., drain, source, collector, emitter) to which the supply voltage is provided.

The amount of time spent sensing memory cells may far exceed the amount of time spent charging the bit lines during program operations. For example, there could be about 100 read operations per each program operation. Moreover, the supply voltage will typically be used to operate other transistors than those in the bit line voltage control circuit. Therefore, the power and/or current savings can be considerable.

Also, in addition to saving power and/or current die size can be reduced. The magnitude of the supply voltage may impact design choice for transistor parameters such as transistor length and gate dielectric thickness. Even if the supply voltage is not directly applied to a control gate of a transistor, the magnitude of the supply voltage can impact the magnitude of the control gate voltage needs to be used. One issue with transistors is a time-dependent gate dielectric breakdown (TDDB). In some embodiments, the supply voltage will be at the lower magnitude up to 98 percent of the time. Therefore, TDDB can be reduced, which can allow smaller transistors and/or thinner gate dielectrics to be used, which reduces die size. Also, the spacing between the lines that carry the supply voltage and other lines can potentially be reduced if the supply voltage is lower.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables"). A portion of local high speed memory 140 may also be used as a parity buffer. For example, the memory controller may calculate parity data as user data is being programmed to the storage 130. The parity data may be temporarily stored in the local high speed memory 140 prior to writing the parity data to the storage 130.

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

XOR engine 166 computes parity data (or more briefly "parity") for data that is written to storage 130. The parity data may be temporarily stored in a parity buffer in local memory 140. In some embodiments, the parity data is repeatedly updated based on the latest data that is written to storage 130, which is referred to herein as accumulating parity data. In some embodiments, the XOR engine 166 accumulates XOR data by successively performing bitwise XOR operations on the data that is presently written to the storage 130 and present parity data in the local memory 140. The present parity data in the local memory 140 contains results of previous XOR operations. In other words, the XOR engine 166 may perform an XOR between data being transferred to storage 130 and the contents of some portion of the parity buffer, and then store the result back into that portion of the parity buffer. Therefore, the parity data in the local memory 140 may be updated as user data is being written to the storage 130. In some embodiments, the processor 156 provides the XOR engine 166 with addresses in the local memory 140. These addresses inform the XOR engine 166 of the locations in local memory 140 should be accessed to form the bitwise XOR, as well as where to store the result in local memory 140.

In one embodiment, XOR engine 166 is a custom and dedicated hardware circuit. In some embodiments, the XOR engine 166 is an electrical circuit programmed by software. For example, XOR engine 166 can be a processor that can be programmed. In one embodiment, the function of XOR engine 166 is implemented by processor 156. In some embodiments, the XOR engine comprises multiple engines, which are able to independently perform XOR operations.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
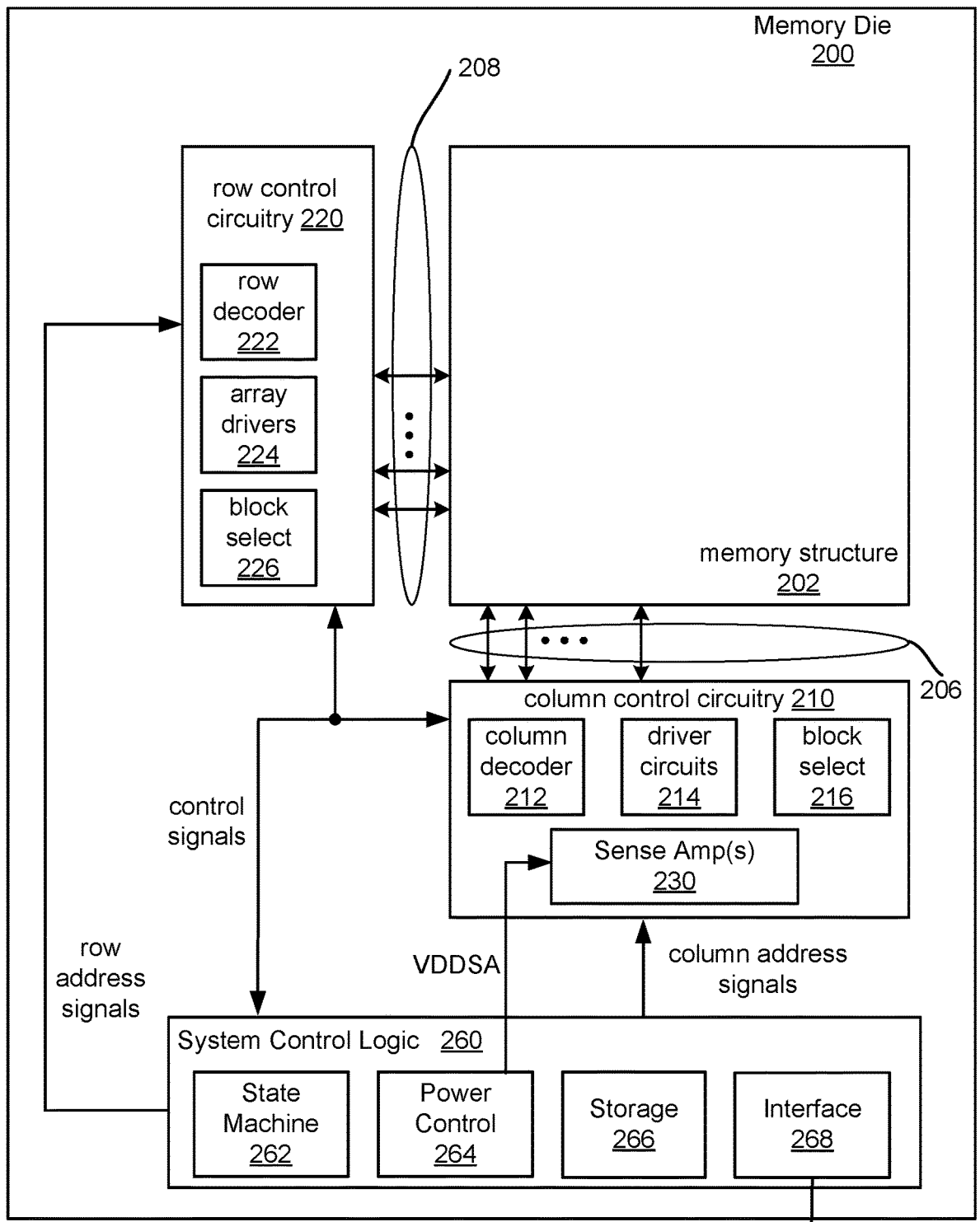
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. Thus, power control module 264 may include a voltage source. In an embodiment, the voltage source is configured to provide a supply voltage having a first magnitude and a second magnitude that is lower than the first magnitude. In some embodiments, the state machine 262 controls the magnitude of a supply voltage (e.g., VDDSA) that is provided from the power control 264 to the sense amps 230. In an embodiment VDDSA has a higher magnitude (e.g., VDDSA_HI) and a lower magnitude (e.g., VDDSA_LOW). In an embodiment, the state machine 262 selects a greater magnitude for VDDSA during an inhibited bit line charging phase of a program operation than for a verify phase. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
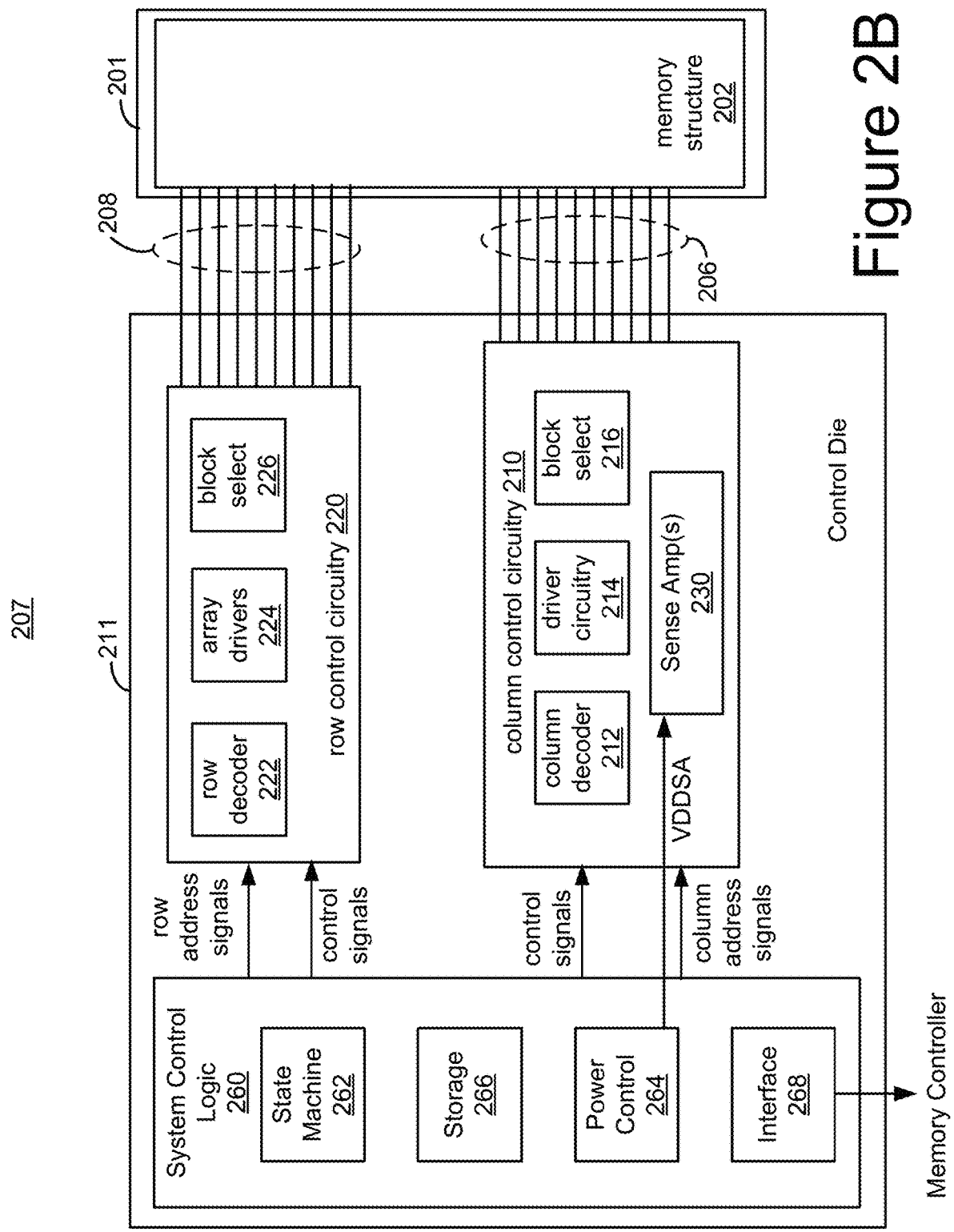
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 2C:
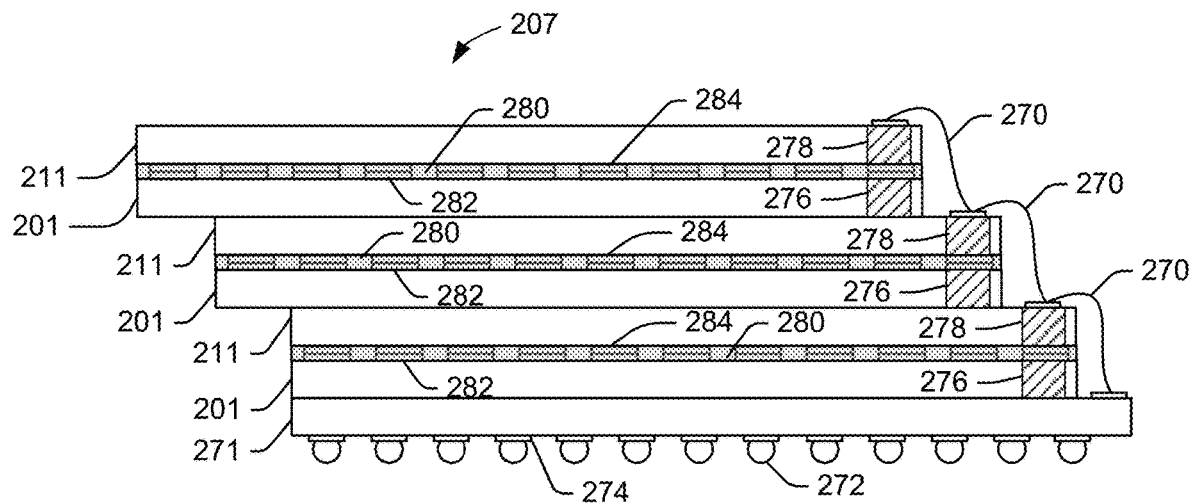
FIGS. 2C and 2D depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 2C depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
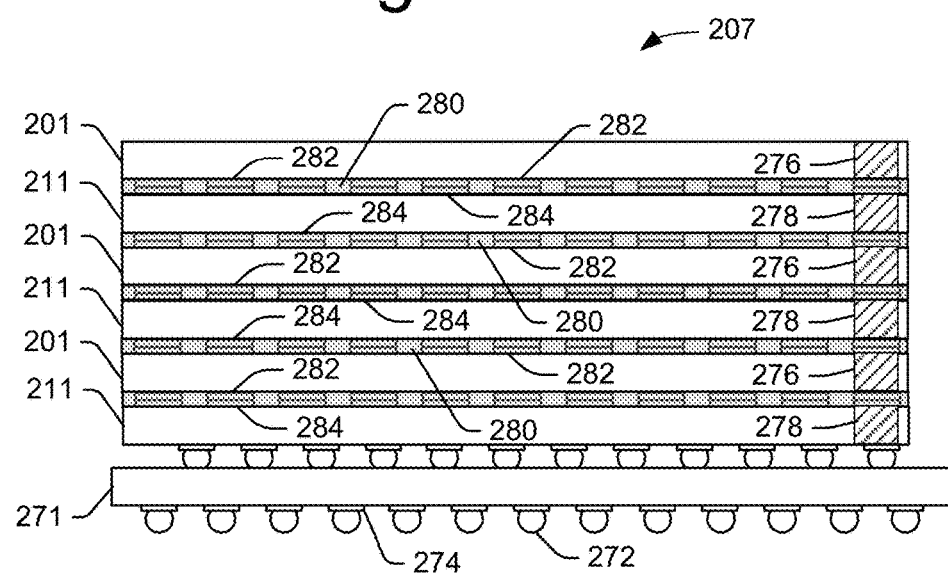

FIG. 2D depicts a side view of another embodiment of an integrated memory assembly 207 stacked on a substrate 271. The integrated memory assembly 207 of FIG. 2D has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3:
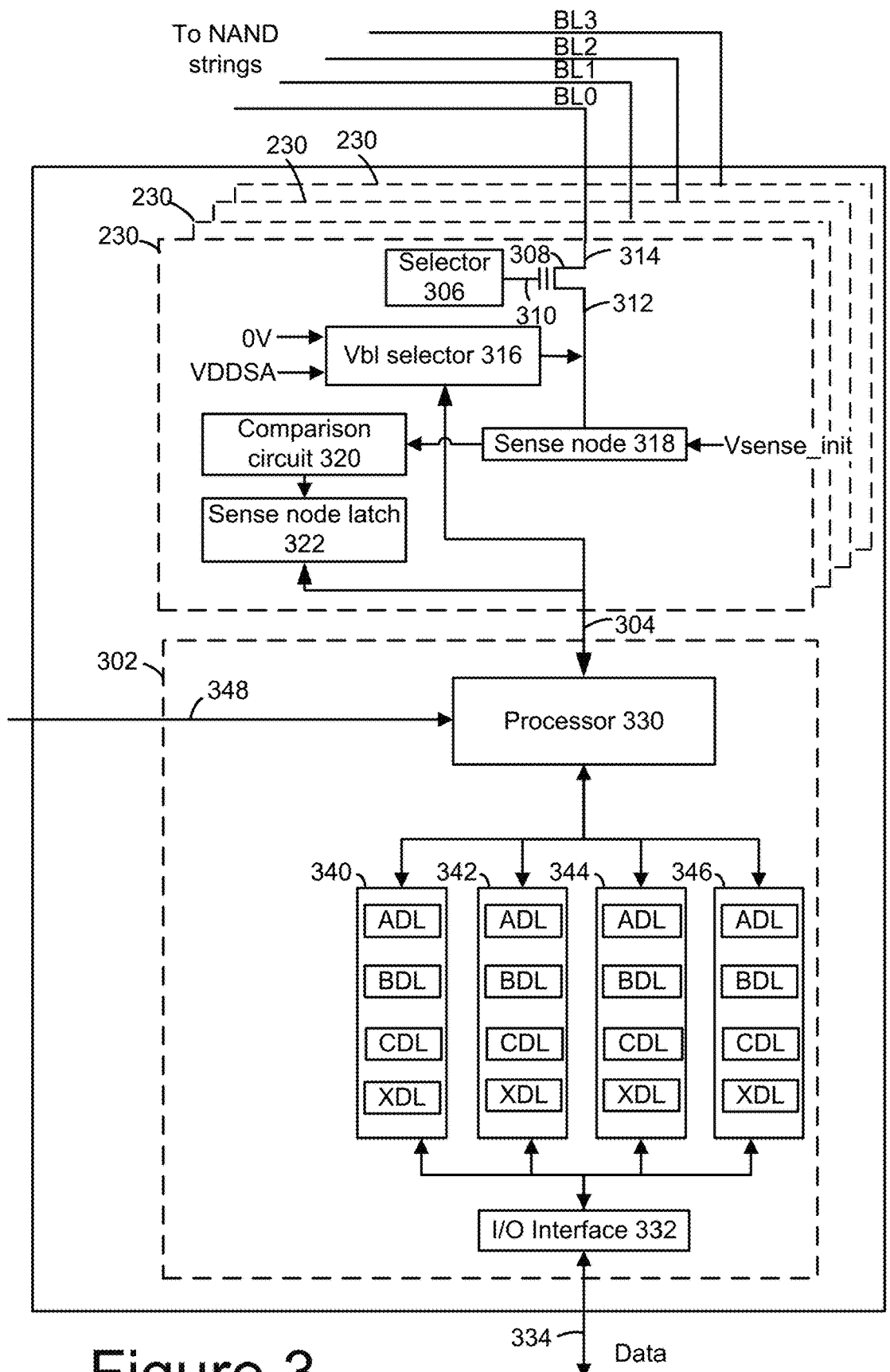
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line. Each bit line may be connected, at one point in time, to one of a large number of different NAND strings. A select gate on the NAND string may be used to connect the NAND string channel to the bit line. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) to the source 314 of the transistor. For example, a program-inhibit voltage such as 2.2 V may be passed to the bit line when pre-charging and inhibiting an unselected NAND string. Or, a program-enable voltage such as 0V may be passed to the bit line to allow programming in a selected NAND string. In one embodiment, a voltage that is between the program-inhibit voltage and the program-enable voltage is passed to the bit line to allow for slow programming. This slower programming voltage is referred to herein as a quick pass write (QPW) voltage. For example, the QPW voltage may be about 0.5V to 0.7V. The selector 306 may pass a power supply voltage Vdd, (e.g., 3-4 V) to the control gate of the transistor 308 to cause it to operate as a pass gate.

The transistor 308 can be operated as a source-follower to set or clamp the bit line voltage. One condition to operate as a source-follower is for the voltage at the control gate 310 of transistor 308 to be lower than the voltage on the drain 312. When acting as a source-follower the bit line voltage is set or clamped at Vcg−Vth, where Vcg is the voltage on the control gate 310 and Vth, e.g., 0.7 V, is the threshold voltage of the transistor 308. This assumes the source line (see SL in FIG. 4B) is at 0 V. The source line voltage is referred to herein as Vcelsrc. If Vcelsrc is non-zero, the bit line voltage is clamped at Vcg−Vcelsrc−Vth. The transistor 308 is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as VDDSA to the drain 312, which is higher than the control gate voltage on the transistor 308, to provide the source-follower mode during sensing operations. Vbl refers to the bit line voltage. In an embodiment, VDDSA is at the lower magnitude (e.g., VDDSA_LOW) when transistor 308 is in the source-follower mode.

The Vbl selector 316 may be used to control the voltage at the drain 312 of the BLC transistor 308. The Vbl selector 316 can pass one of a number of voltage signals to the drain 312 of the BLC transistor 308. As noted, the Vbl selector 316 can pass a relatively high voltage to cause the BLC transistor 308 to act as a source follower during read and verify operations. The Vbl selector 316 can pass one of a number of voltage signals to the drain 312 of the BLC transistor 308 during a program phase of a program operation when the BLC transistor 308 is operated as a pass gate. As noted above, when the BLC transistor 308 is operated as a pass gate the voltage at the drain 312 of the BLC transistor 308 is passed to the bit line. As one example, the Vbl selector 316 passes a program enable voltage (e.g., 0V) to the drain 312 of the BLC transistor 308. As another example, the Vbl selector 316 passes a program inhibit voltage (e.g., 2.2V) to the drain 312 of the BLC transistor 308. In an embodiment, VDDSA is at the higher magnitude (e.g., VDDSA_HI) when transistor 308 is in the pass-gate mode. Note that the magnitude of VDDSA that is provided to Vbl selector 316 may be controlled by the state machine 262.

The Vbl selector 316 inputs a signal from the processor 330 that controls the voltage output by the Vbl selector 316 during programming. The Vbl selector 316 also inputs a supply voltage that is referred to herein as VDDSA, as well as a low voltage (e.g., 0V). In some embodiments, the magnitude of VDDSA is dynamically adjusted as described herein. In some embodiments, the Vbl selector 316 is operated to pass either VDDSA or 0V to the drain 312 of the BLC transistor 308. For example, if processor 330 provides a "1" to the Vbl selector 316 this indicates that the memory cell on the bit line is to receive programming, wherein the Vbl selector 316 outputs a program enable signal (e.g., 0V) to the drain 312 of the BLC transistor 308. As another example, if the processor 330 provides a "0" to the Vbl selector 316 this indicates that the memory cell on the bit line is to be inhibited from programming, wherein the Vbl selector 316 outputs a program inhibit signal (e.g., 2.2V) to the drain 312 of the BLC transistor 308. In some embodiments, the processor 330 will provide a signal to the Vbl selector 316 to indicate that the memory cell on the bit line is to receive slow programming, wherein the Vbl selector 316 outputs a QPW signal (e.g., 0.6V) to the drain 312 of the BLC transistor 308.

The Vbl selector 316 comprises one or more transistors. These one or more one or more transistors are connected to the drain 312 of the BLC transistor 308. One of the transistors in the Vbl selector 316 has a drain terminal that is configured to receive the voltage VDDSA. In some embodiments, VDDSA is dynamically adjusted. In one embodiment, the one or more transistors of the Vbl selector 316 are controlled to pass VDDSA to the drain 312 of the BLC transistor 308 under at least some conditions. In one embodiment, the one or more transistors of the Vbl selector 316 are controlled to pass VDDSA to the drain 312 of the BLC transistor 308 during read and verify operations, when the BLC transistor 308 is operated as a source follower. Also, if the bit line is to receive a program inhibit voltage, the one or more transistors of the Vbl selector 316 are controlled to pass VDDSA to the drain 312 of the BLC transistor 308 during the program operation, when the BLC transistor 308 is operated as a pass gate. However, in one embodiment, if the bit line is to receive a program enable voltage, the one or more transistors of the Vbl selector 316 are controlled to pass the program enable voltage (e.g., 0V) to the drain 312 of the BLC transistor 308 during the program operation, when the BLC transistor 308 is operated as a pass gate.

In some embodiments, VDDSA is dynamically adjusted based on what memory operation or portion thereof is being performed. In one embodiment, VDDSA has a lower magnitude during sensing operations (verify, read) than during at least a portion of a program operation. For example, VDDSA may be about 2.2V during the program operation and about 1.8V during sensing operations. In some embodiments, VDDSA is dynamically adjusted during the program phase of the program operation. For example, VDDSA may be about 2.2V when the program inhibit voltage is passed to the inhibited bit line. However, VDDSA may be lowered to about 1.8V after the program inhibit voltage is passed to the inhibited bit line but prior to applying the program voltage to a selected word line.

Using a lower magnitude for VDDSA reduces current and/or power consumption. also, using a lower magnitude for VDDSA can allow for die size reduction. However, using the higher magnitude for VDDSA at least while charging the inhibited bit lines during program operations maintains pre-charge/program inhibit capability.

In one embodiment, the selector 306 of each sense circuit can be controlled separately from the selectors of other sense circuits. In one embodiment, the Vbl selector 316 of each sense circuit can also be controlled separately from the Vbl selectors of other sense circuits.

During sensing, a sense node 318 is charged up to an initial voltage, Vsense_init, such as 3V. The sense node is then connected to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or a program enable level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or fewer than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two agree, processor 330 sets the bit line in a program inhibit mode such as by updating its latches. This inhibits the memory cell coupled to the bit line from further programming even if additional program pulses are applied to its control gate.

Figure 4A:
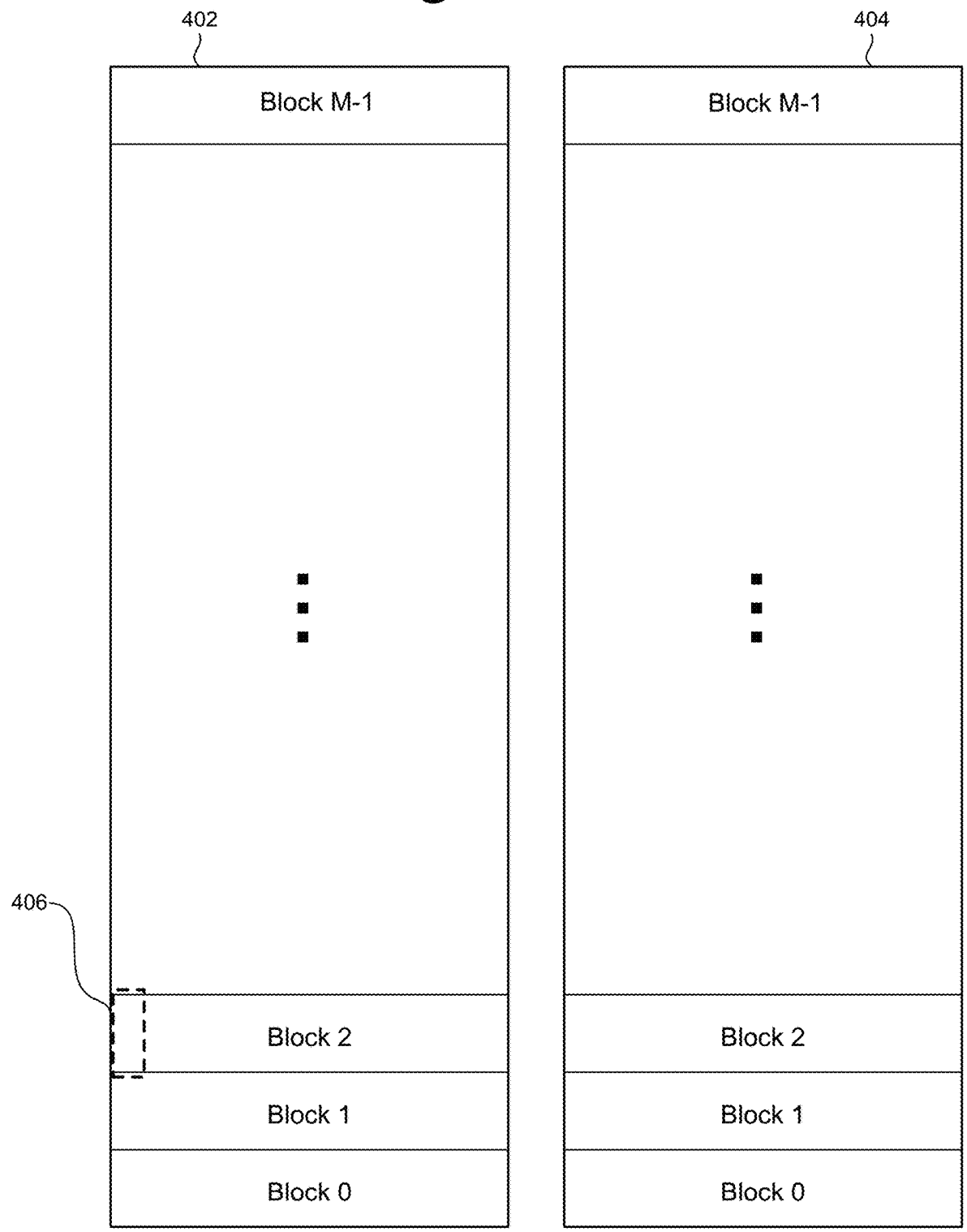
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or fewer than two planes can be implemented. In some embodiments, memory structure 202 includes four planes. In some embodiments, memory structure 202 includes eight planes. In some embodiments, programming can be performed in parallel in a first selected block in plane 402 and a second selected block in plane 404.

Figure 4B:
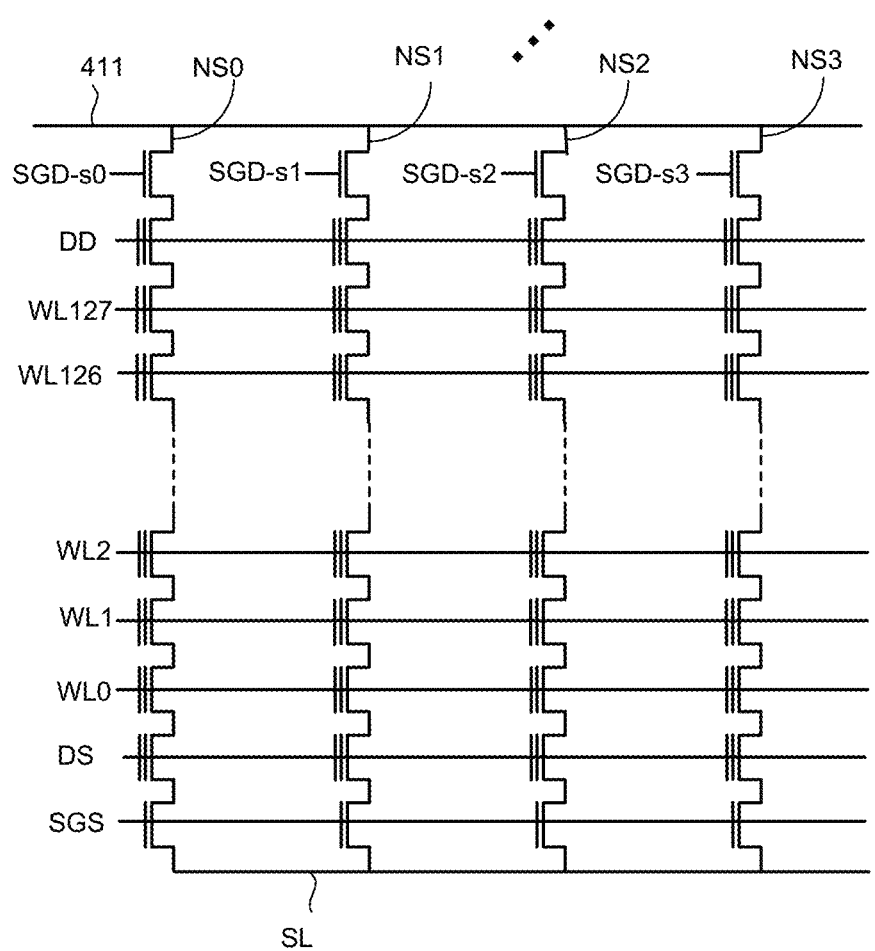
FIG. 4B is a schematic of a plurality of NAND strings in multiple sub-blocks of a same block.

FIG. 4B is a schematic diagram of a portion of the memory structure 202. FIG. 4B shows physical data word lines WL0-WL127 running across the entire block. There is also a source side dummy word line (DS) and a drain side dummy word line (DD), which do not store user data. Also depicted is a source side selected line (SGS) and a several drain side select lines (SGD-s0, SGD-s1, SGD-s2, SGD-s3).

The structure of FIG. 4B corresponds to a portion 406 in Block 2 of FIG. 4A, including bit line 411. Within the block, in one embodiment, each bit line may connect to four NAND strings. Thus, FIG. 4B shows bit line connected to NAND string NS0, NAND string NS1, NAND string NS2, and NAND string NS3.

In one embodiment, there are four drain side select lines in the block (SGD-s0, SGD-s1, SGD-s2, and SGD-s3). Each respective drain side select line can be selected independent of the others. Each drain side select line connects to a group of NAND strings in the block. Only one NAND string of each group is depicted in FIG. 4B. These four drain side select lines correspond to four sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. As noted, FIG. 4B only shows the NAND strings connected to bit line 411. However, a full schematic of the block would show every bit line and four vertical NAND strings connected to each bit line.

In some embodiments, the block is divided into an upper tier and a lower tier, each of which contains half the word lines. For example, the lower tier may contain WL0-WL63 and the upper tier may contain WL64-WL127. In some embodiments, the upper tier and lower tier may be erased independently.

Although the example memories of FIGS. 4A-4B are three dimensional memory structure that includes vertical NAND strings, other (2D and 3D) memory structures can also be used with the technology described herein.

Figure 5A:
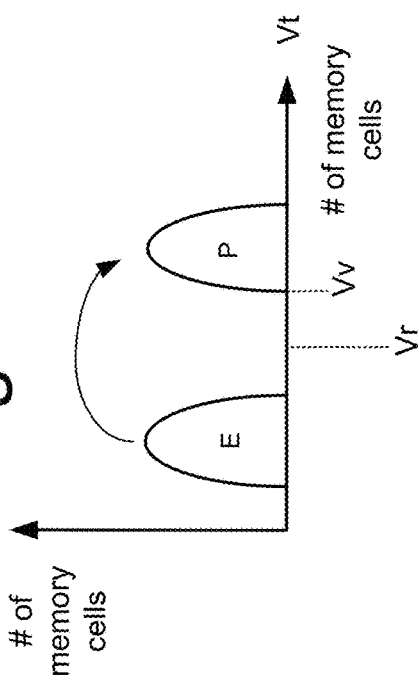
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
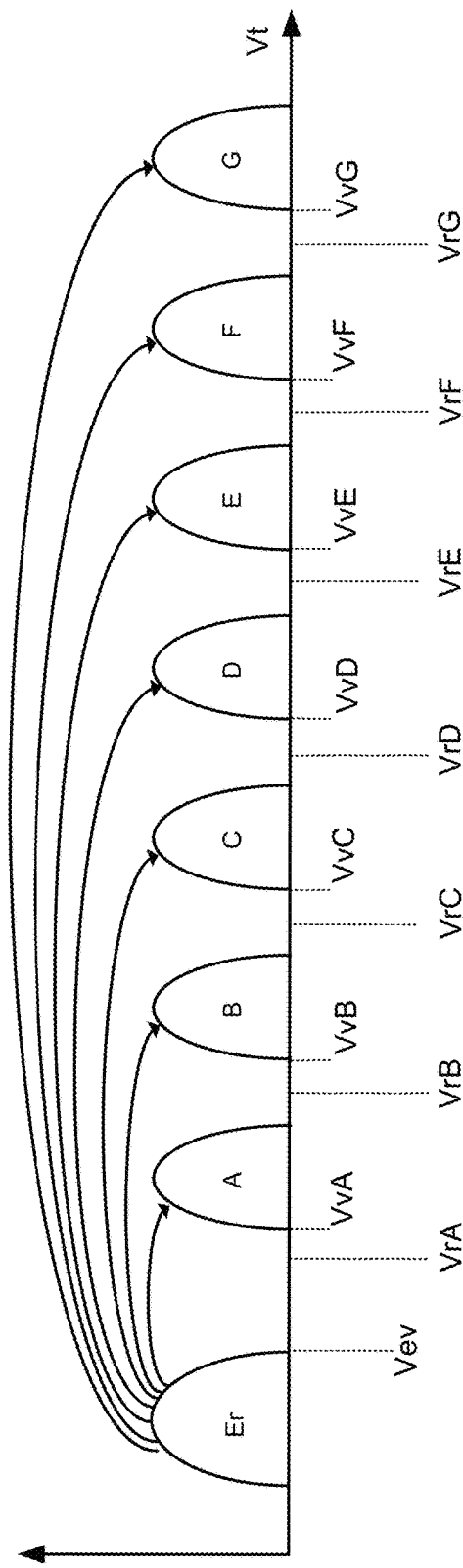

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5B represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

Figure 6:
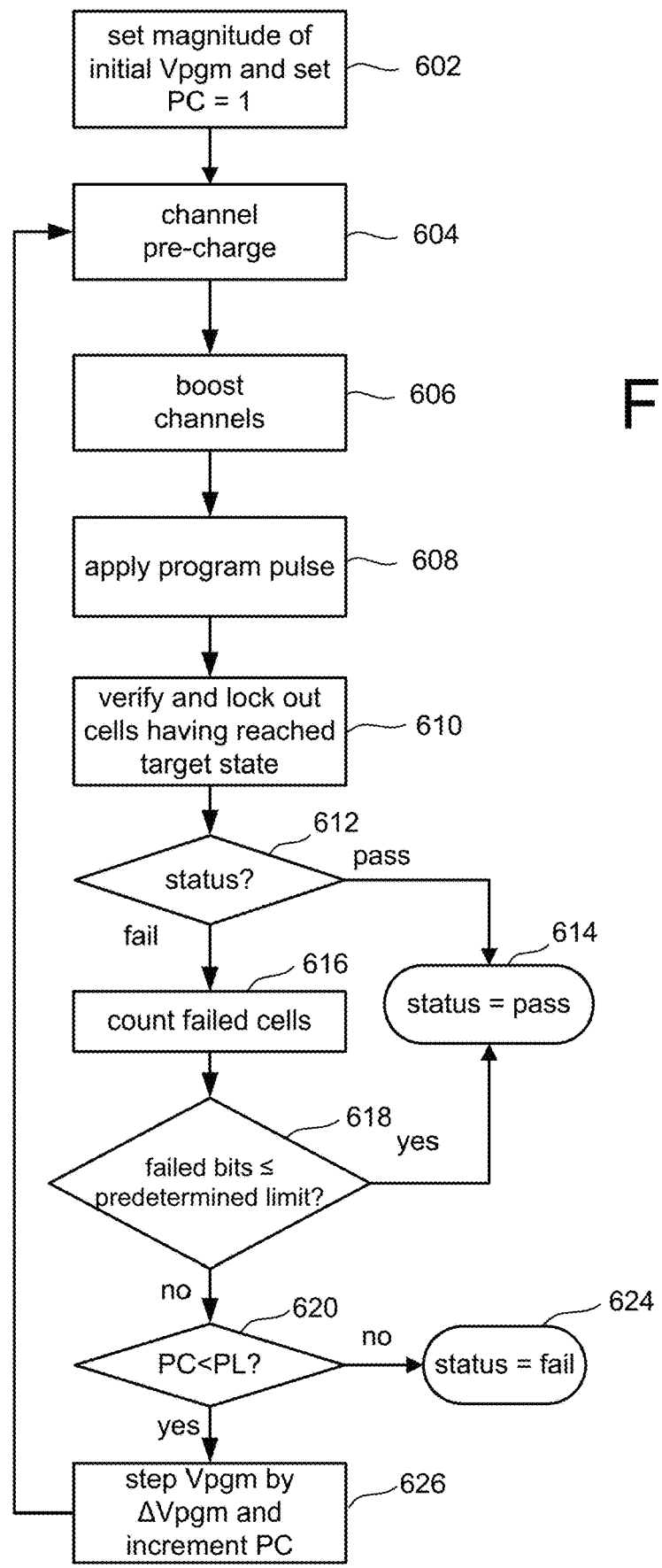
FIG. 6 is a flowchart describing one embodiment of a process for programming non-volatile memory.

FIG. 6 is a flowchart describing one embodiment of a process for programming memory cells. For purposes of this document, the term program and programming are synonymous with write and writing. The process may be used to program user data, as well as parity data for that user data. When programming user data or parity data, one or more ECC codewords may be programmed into a unit of memory cells. In an embodiment, the process is used to program a unit of memory cells that is referred to herein as a page of memory cells. In an embodiment, if each memory cell stores one bit then one page is stored in the page of memory cells. In an embodiment, if each memory cell stores two bits then two pages are stored in the page of memory cells. In an embodiment, if each memory cell stores three bits then three pages are stored in the page of memory cells. In an embodiment, if each memory cell stores four bits then four pages are stored in the page of memory cells. In an embodiment, each page of data includes one or more ECC codewords.

In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify high voltage. If a memory cell has a Vt between the verify low voltage and the verify high voltage, then the memory cell may be marked for slow programing the next program loop. In one embodiment, one or more data latches in the managing circuit 302 are used to indicate whether a memory cell is locked out, is to receive slow programming, or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, the magnitude of a supply voltage (e.g., VDDSA) that is provided to bit line voltage control circuits in respective sense amplifiers is dynamically adjusted during the process of FIG. 6. The supply voltage has a higher magnitude at least when charging bit lines (e.g., step 604) during the program phase and the lower magnitude at least during the verify phase (e.g., step 610). When boosting channels (e.g., step 606) and applying the program pulse (e.g., 608) the supply voltage has the higher magnitude in one embodiment and the lower magnitude in another embodiment.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

Figure 7:
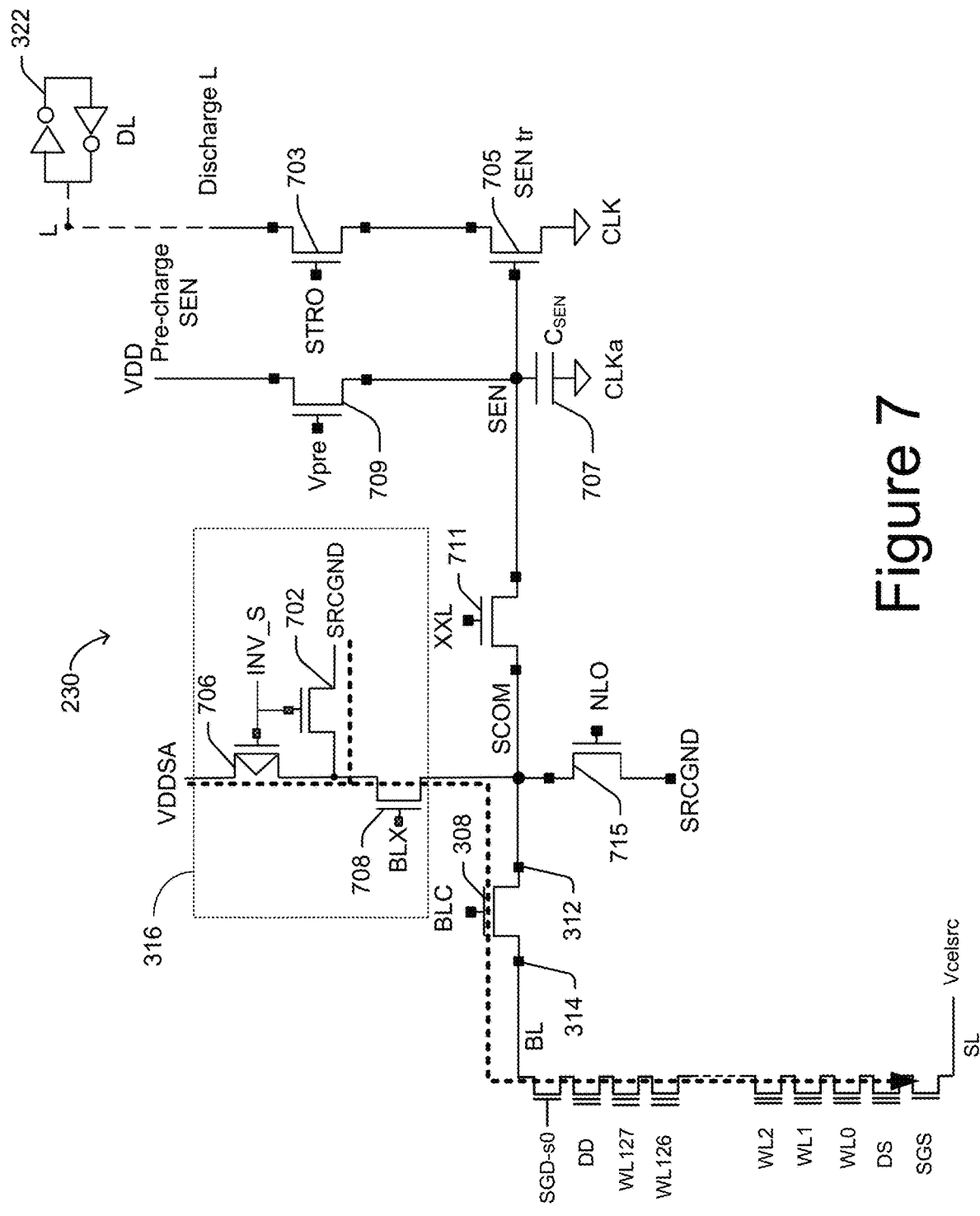
FIG. 7 is a schematic diagram of one embodiment of a sense amplifier.

FIG. 7 is a schematic diagram of one embodiment of a sense amplifier 230. FIG. 7 shows transistors that may be used to charge the bit line. Two charging paths for charging the bit line are depicted in dashed lines. A first path allows the bit line to be charged to VDDSA by a path through transistor 706, BLX transistor 708, and BLC transistor 308. A second path allows the bit line to be charged to SRCGND by a path through transistor 702, BLX transistor 708, and BLC transistor 308. When charging the bit line through either of these paths, the BLC transistor 308 may be operated as a pass gate. When the voltage (BLC) at the control gate of the BLC transistor 308 is sufficiently higher than the voltage on the drain 312, the BLC transistor 308 operates as a pass gate to pass the voltage at the drain 312 to the bit line (BL) at the source 314 of the BLC transistor 308. VDDSA may be provided by a voltage source in the power control (see power control 264 in FIG. 2A or 2B) with the state machine 262 selecting the magnitude of VDDSA.

During read and verify operations, the BLC transistor 308 may be operated as a source-follower to clamp the voltage on the bit line at a sense voltage. When operated as a source-follower, the voltage at the control gate of the BLC transistor 308 is lower than the voltage on the drain 312. The BLC transistor 308 operates as a source-follower to set or clamp the bit line voltage at Vcg−Vcelsrc−Vth, where Vcg is the voltage on the control gate 310 and Vth is the threshold voltage of the BLC transistor 308. The Vth of the BLC transistor 308 may be about 0.7V. In order to operate as a source-follower, the voltage at the drain 312 of the BLC transistor 308 should be higher than the control gate voltage (BLC) on the BLC transistor 308.

The combination of supply voltage transistor 706, BLX transistor 708, and source transistor 702 are one embodiment of the Vbl selector 316 (see FIG. 3). In an embodiment, the combination of supply voltage transistor 706, BLX transistor 708, source transistor 702, and BLC transistor 308 are one embodiment of a bit line voltage control circuit. A bit line voltage control circuit, as defined herein, is an electronic circuit that is configured to control a voltage of a bit line. In one embodiment, the bit line voltage control circuit is configured to pass either VDDSA or SRCGND to the bit line depending on the value of INV_S. The value of INV_S may be provided by processor 330 (see FIG. 3), and may represent whether the memory cell is to receive programming (by passing SRCGND to the bit line) or to be inhibited from programming (by passing VDDSA to the bit line). In one embodiment, the BLC transistor 308 is controlled to operate in either a pass-gate mode or a source-follower mode. Note that there may be one or more transistors between the BLC transistor 308 and the bit line. Thus, the BLC transistor 308 is not necessarily directly connected to the bit line.

The sense amplifier 230 may also be used to sense a state of the selected memory cell on the NAND string connected to the BL. A sensing node SEN is connected to a sense capacitor Csen 707. The voltage level on the SEN node is set by pre-charging SEN to VDD through Vpre 709, after which it is connected to a selected memory cell by way of the XXL transistor 711 and BLC transistor 308. The SCOM node between XXL 711 and BLC 308 can be set to a value, such as ground or pre-charged to a higher level, by way of transistor NLO 715 when XXL 711 and BLC 308 are off. The current of the bit line will depend on whether the memory cell's Vt is above or below the reference voltage applied to the memory cell. The bit line current may discharge SEN. Thus, if the memory cell is conductive, then SEN is discharged. If the memory cell is not conductive, then SEN is not discharged.

The sense transistor (SEN tr) 705 is used to test the magnitude of the voltage on SEN. Specifically, a strobe transistor 703 is turned on by STRO to test the magnitude of the voltage on SEN. The latch 322 represents the sense node latch 322 (see FIG. 3). There may be other latches such as ADL, BDL, CDL, and XDL (see FIG. 3). The value of the latch 322 is determined by the voltage level on the node L, where the node L may be pre-charged to the high VDD level and then, depending on the voltage level on the SEN node, either discharged or not through the transistor SEN tr 705 to the node CLK during a strobe operation when the transistor STRO 703 is turned on. As noted, the voltage level on the SEN node is pre-charged to VDD through Vpre 709, after which it is connected to a selected memory cell.

The following describes one embodiment of minimum voltage requirements for VDDSA for a read or verify operation. In an embodiment, the minimum VDDSA during read or verify is based on the voltage on the source line (SL), as well as several other voltage considerations that are based on possible voltage drops across components along the path between transistor 706 and the source line. The equation can be expressed as Vcelsrc+Vbl+V_BLC2BLX+V_BLX2XXL+VDDSA_IRdrop+transistor variation. In the foregoing, Vbl is a voltage associated with the bit line, V_BLC2BLX is a voltage across the BLC transistor 308, V_BLX2XXL is a voltage across the BLX transistor 708, VDDSA_IRdrop is a voltage across transistor 706. The transistor variation accounts for variation between the transistors in the different sense amplifiers due to, for example, variations in the semiconductor fabrication process. Note in particular that if a lower voltage is used for Vcelsrc that a lower voltage can be used for VDDSA during read and verify. Power and/or current can be saved by using a lower magnitude of VDDSA during read or verify operations.

On the other hand, VDDSA is used to charge inhibited bit lines during a program operation. If the magnitude of VDDSA is too low during a program operation then the Vt distributions (see FIG. 5B) are negatively impacted. For example, some of the memory cells that are to be inhibited to prevent programming of the memory cell could fail to be properly inhibited if VDDSA is too low. The memory cell is inhibited from programming by cutting off the NAND string channel from the bit line and boosting the channel voltage of the NAND string by applying boosting voltages to unselected memory cells on the NAND string. A factor in cutting off the NAND string channel from the bit line is the Vt of the SGD transistor on the NAND string. There will be some variation in the Vt of the SGD transistors on the different NAND strings. If VDDSA is not high enough given the Vt of the SGD transistor, there could be leakage of charge from the NAND string channel to the bit line, which will impair voltage boosting of the NAND channel. Therefore, a memory cell could be overprogrammed.

In some embodiments, the magnitude of VDDSA that is provided to the sense amplifier 230 is dynamically adjusted to allow for proper programming (and inhibiting of programming) and to reduce power/current during sense operations. In some embodiments, the magnitude of VDDSA is higher when charging inhibited bit lines and lower when sensing memory cells.

Figure 8:
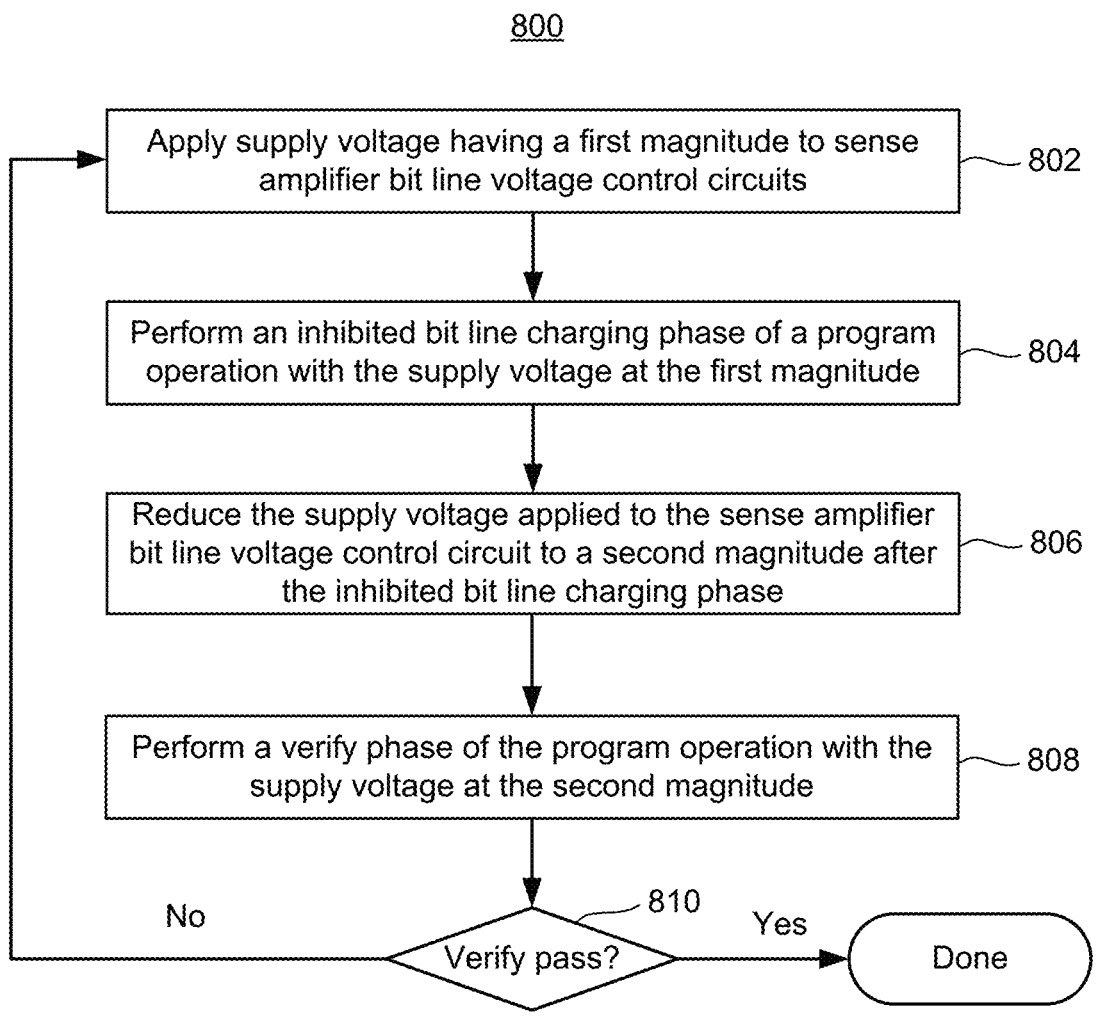
FIG. 8 is a flowchart of one embodiment of a process of dynamically adjusting a supply voltage that is provided to sense amplifiers.

FIG. 8 is a flowchart of one embodiment of a process 800 of dynamically adjusting a supply voltage that is provided to sense amplifiers. In an embodiment, the sense amplifiers 230 are used to control voltages on bit lines in a memory structure 202. In an embodiment, the memory structure 202 contains NAND strings. The NAND strings, in one embodiment, reside in a 3D memory structure. Process 800 may be performed by one or more control circuits such as a combination of memory controller 120, state machine 262, power control 264, all or a portion of system control logic 260, all or a portion of row control circuitry 220, all or a portion of column control circuitry 210, and/or sense amps 230.

Step 802 includes applying a supply voltage having a first magnitude to bit line voltage control circuits of sense amplifiers. In one embodiment, the bit line voltage control circuits include supply voltage transistor 706, BLX transistor 708, source transistor 702, and BLC transistor 308. In one embodiment, the supply voltage (e.g., VDDSA) is provided to the drain of the supply voltage transistor 706 in the respective sense amplifiers 230. As one example, the first magnitude is about 2.2V.

Step 804 includes performing an inhibited bit line charging phase of a program operation with the supply voltage at the first magnitude. As defined herein an "inhibited bit line" is a bit line that is associated with a NAND string having a memory cell connected to the selected word line that is to be inhibited from programming. The NAND string that is connected to an inhibited bit line will be referred to as an unselected NAND string. The selected word line is the word line to which the programming voltage will be applied in the program operation. As defined herein an "inhibited bit line charging phase" is a phase of a program operation in which inhibited bit lines are charged by the sense amplifier 230 to a program inhibit voltage. In an embodiment, the program inhibit voltage is sufficiently large such that the drain side select gates of unselected NAND strings will be off in order to cut off the unselected NAND string channel from the bit line. Step 804 includes passing the supply voltage to inhibited bit lines in order to charge the inhibited bit lines to the supply voltage. Step 804 may also include passing a program enable voltage (e.g., 0V) selected bit lines. As defined herein a "selected bit line" is a bit line that is associated with a NAND string in which the memory cell connected to the selected word line is to receive programming. A NAND string that is connected to a selected bit line may be referred to herein as a selected NAND string. In one embodiment, the BLC transistors 308 are operated in step 804 in a pass-gate mode to pass a voltage at the drain 312 of the respective BLC transistors 308 to the bit lines.

Step 806 includes reducing the supply voltage to the sense amplifiers to a second magnitude after the inhibited bit line charging phase. Note that step 806 may be performed after the inhibited bit line charging phase but prior to a programming phase in which a programming voltage is applied to memory cells. However step 806 may be performed after the entire programming phase for this loop is complete. An example of the second magnitude is 1.8V.

Step 808 includes performing a verify phase of the program operation with the supply voltage at the second magnitude. In one embodiment, the BLC transistors 308 are operated in a source-follower mode to clamp the bit lines to a sense voltage (Vsense).

In step 810 a determination is made whether the programming is complete, based on the verify. If not, steps 802-808 are again performed for the next program loop. Thus, the supply voltage is lowered to the first magnitude to again perform step 802.

Figure 9:
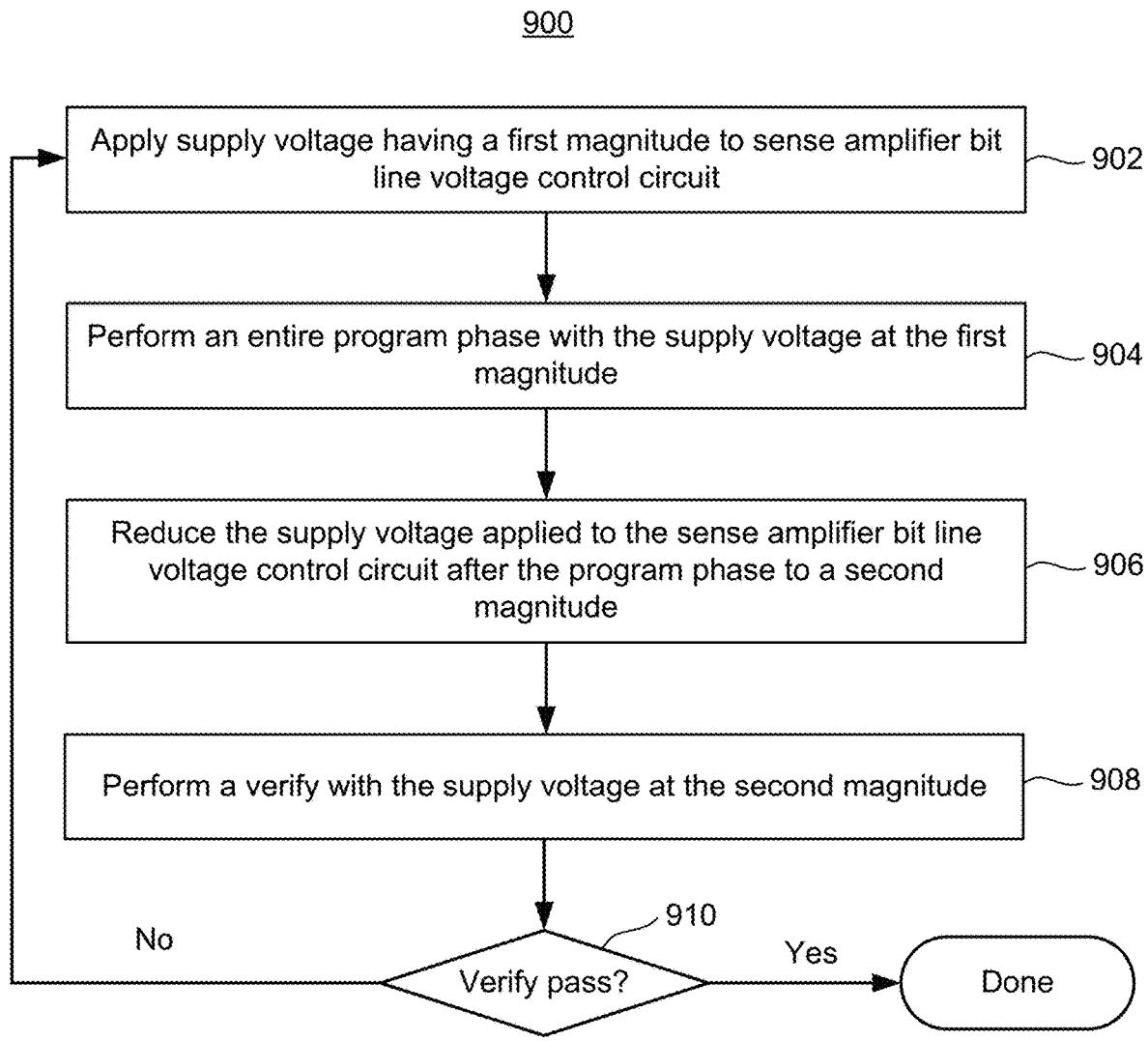
FIG. 9 is a flowchart of one embodiment of a process of dynamically adjusting a supply voltage in which the supply voltage is maintained at the first (higher) magnitude during the entire program phase.

In one embodiment, the supply voltage is maintained at the first (higher) magnitude during the entire program phase, and only at the second (lower) magnitude during the verify operation. FIG. 9 is a flowchart of one embodiment of a process 900 of dynamically adjusting a supply voltage in which the supply voltage is maintained at the first (higher) magnitude during the entire program phase. Process 900 is one embodiment of process 800.

Step 902 includes applying a supply voltage having the first magnitude to bit line voltage control circuits of sense amplifiers. Step 902 is similar to step 802. Step 904 includes performing an entire program phase (of one program loop) with the supply voltage at the first magnitude. Step 904 includes performing step 804 of process 800. That is step 904 includes the inhibited bit line charging phase of the program operation. Step 904 also includes a programming phase in which a program voltage is applied to memory cells to program the memory cells. Step 904 may include performing steps 604, 606, and 608 of FIG. 6.

Step 906 includes reducing the supply voltage to the sense amplifiers to the second magnitude. Step 906 is performed after the programming phase for this loop is complete, but prior to the verify of this loop.

Step 908 includes performing a verify phase with the supply voltage at the second magnitude. Step 908 is similar to step 808. Step 908 may include performing step 610 of FIG. 6.

In step 910 a determination is made whether the programming is complete, based on the verify. If not, steps 902-908 are again performed for the next program loop. Thus, the supply voltage is lowered to the first magnitude to again perform step 902.

Figure 10:
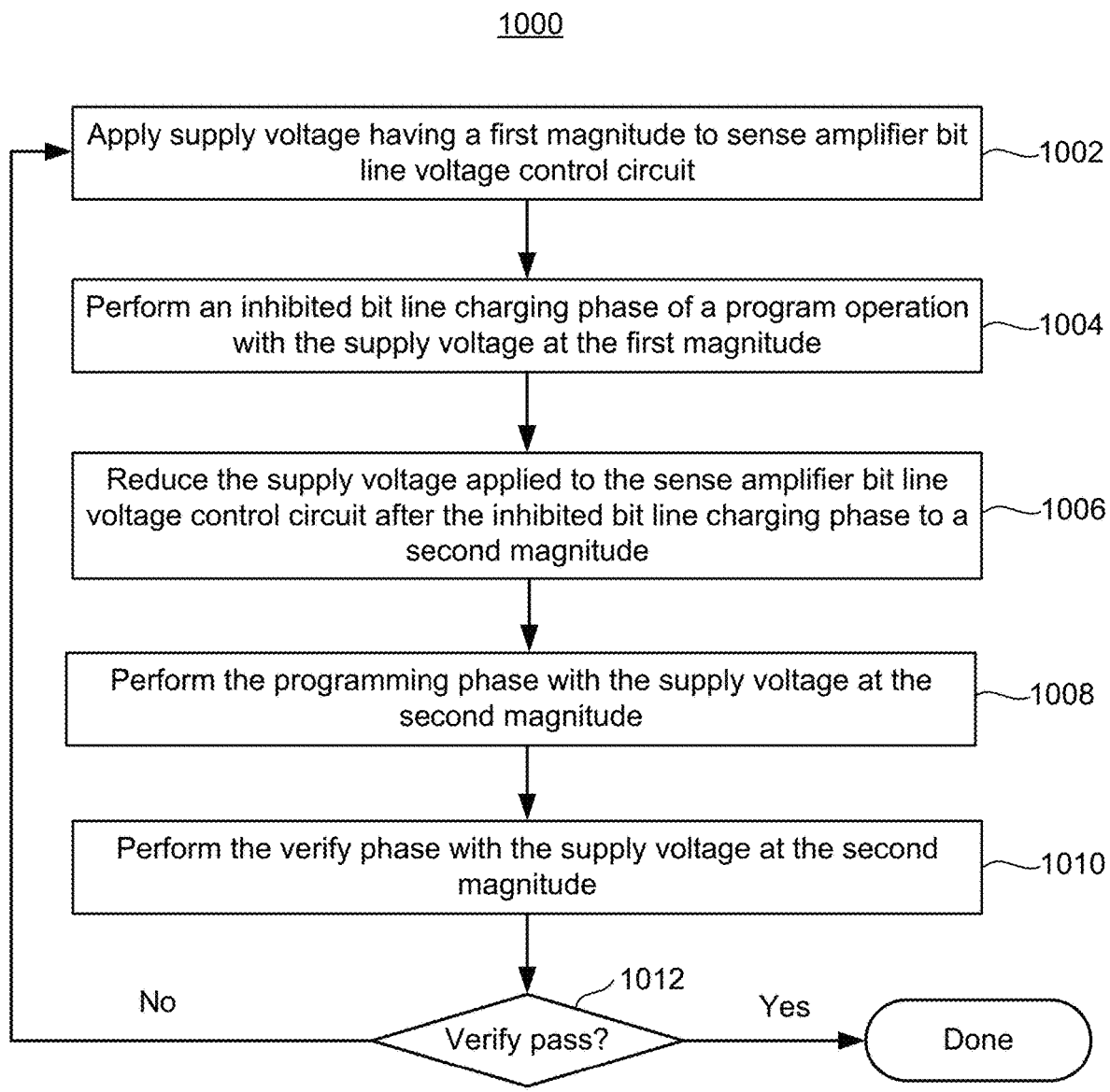
FIG. 10 is a flowchart of one embodiment of a process of dynamically adjusting a supply voltage in which the supply voltage is maintained at the first (higher) magnitude during only a portion of the program phase.

In one embodiment, the supply voltage is maintained at the first (higher) magnitude during only a portion of the program phase. For example, the supply voltage may be lowered after charging the bit lines but prior to the programming phase. This lowering of the supply voltage at an earlier point than process 900 will save more power/current than process 900, while still allowing the inhibited bit lines to be charged to a sufficient voltage to inhibited programming of memory cells that should not receive programming. FIG. 10 is a flowchart of one embodiment of a process 1000 of dynamically adjusting a supply voltage in which the supply voltage is maintained at the first (higher) magnitude during only a portion of the program phase. Process 1000 is one embodiment of process 800.

Step 1002 includes applying a supply voltage having the first magnitude to bit line voltage control circuits of sense amplifiers. Step 1002 is similar to step 802. Step 1004 includes performing an inhibited bit line charging phase of the program operation with the supply voltage at the first magnitude. Step 1002 may include performing step 604 in FIG. 6.

Step 1006 includes reducing the supply voltage to the sense amplifiers to the second magnitude after the inhibited bit line charging phase of this loop, but prior to the programming phase of this loop.

Step 1008 includes performing the programming phase for this loop with the supply voltage to the sense amplifiers at the second magnitude. Step 1008 includes applying a program voltage to a selected word line. Step 1008 may also include applying boosting voltages to unselected word lines. Step 1008 may include performing steps 606 and 608 in FIG. 6.

Step 1010 includes performing the verify operation for this loop with the supply voltage at the second magnitude. Step 1010 is similar to step 808. Step 1010 may include performing step 610 in FIG. 6.

In step 1012 a determination is made whether the programming is complete, based on the verify. If not, steps 1002-1010 are again performed for the next program loop. Thus, the supply voltage is lowered to the first magnitude to again perform step 1002.

Figure 11:
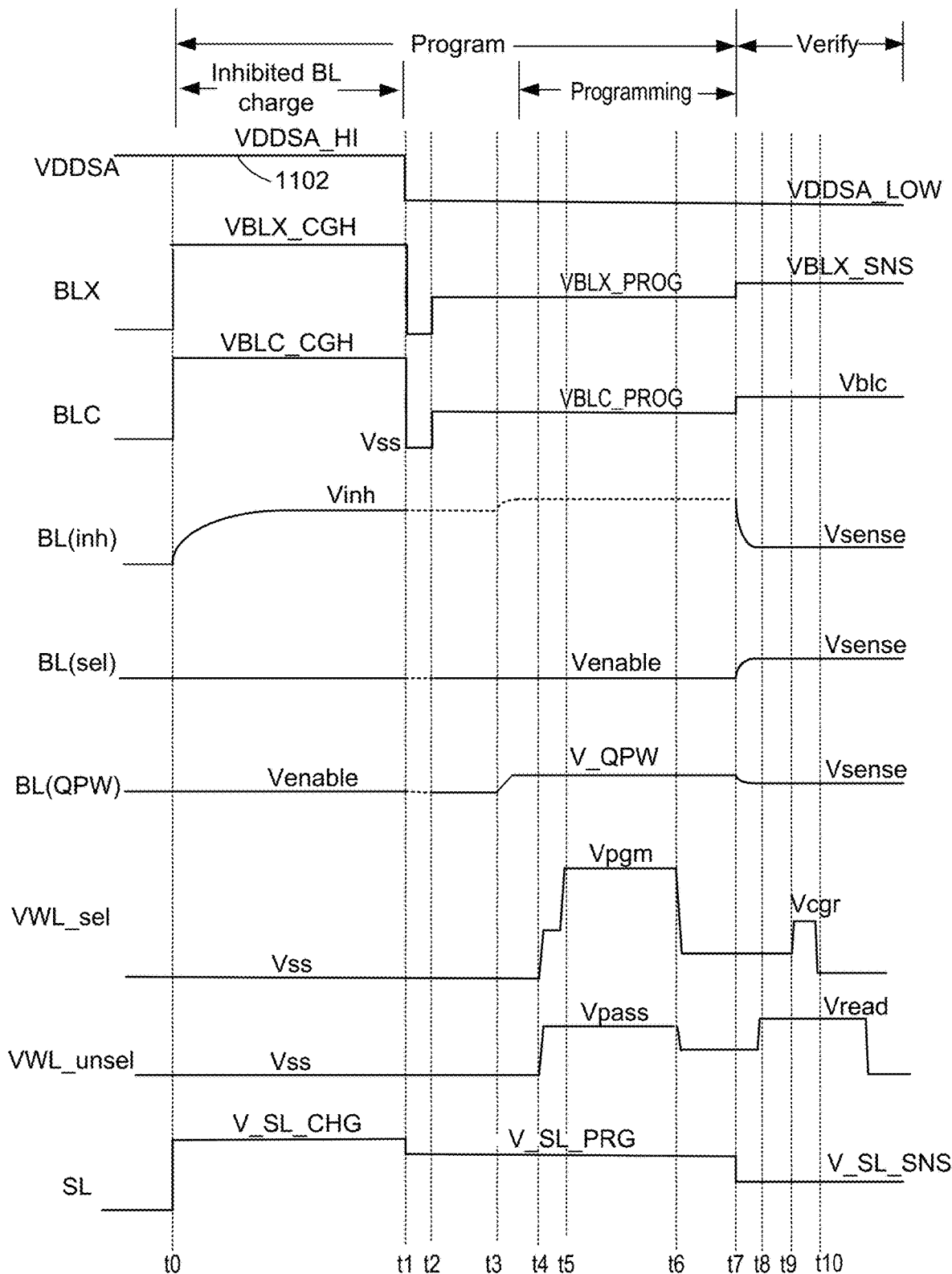
FIG. 11 is a timing diagram of voltage waveforms during an embodiment of providing a dynamic supply voltage to sense amplifiers in a memory system.

FIG. 11 is a timing diagram of voltage waveforms during an embodiment of providing a dynamic supply voltage to sense amplifiers in a memory system. The timing corresponds to an embodiment of process 1000. The diagram pertains to a program phase followed by a verify phase. The program phase includes an inhibited bit line charging phase and a programming phase. The inhibited bit line charging phase is performed in one embodiment of step 1004. The programming phase is performed in one embodiment of step 1008. The verify phase is performed in one embodiment of step 1010.

The voltage waveform 1102 is the supply voltage VDDSA that is provided to the sense amplifiers 230. The voltage waveform 1102 has magnitude of VDDSA_HI during the inhibited bit line charging phase. The voltage waveform 1102 has magnitude of VDDSA_LOW during the programming phase and the verify phase. In one embodiment, VDDSA_HI is about 2.2V and VDDSA_LOW is about 1.8V.

FIG. 11 depicts the control voltage BLX that is applied to the BLX transistor 708 and the control voltage BLC that is applied to the BLC transistor 308. Example voltages for an inhibited bit line (BL(Inh)) and a selected bit line (BL(sel)) are depicted. The waveform BL(QPW) is for a bit line that receives the QPW voltage during programming. All of these bit lines may be treated the same during verify, as indicated by Vsense. The waveform VWL_sel is the voltage applied to the word line that is selected for programming. The waveform VWL_unsel is the voltage applied to the word lines that are not selected for programming. The waveform SL is the voltage applied to the source line.

At time t0 VDDSA 1102 is at VDDSA_HI, where it remains until t1. The waveform VDDSA 1102 between t0 and t1 corresponds to one embodiment of step 1002. At time t0, the source line voltage is raised to a voltage V_SL_CHG, which may be about 2.2V. Also at about time t1, BLX and BLC are increased to VBLX_CHG and VBLC_CHG respectively. Between t0 and t1, the BLC transistors 308 are in the pass-gate mode. Referring back to FIG. 7, the value INV_S may be used to pass either VDDSA or SRGGND to the drain 312 of the BLC transistor 308. The waveform BL(inh) shows the charging of the voltage on the inhibited bit lines between t0 and t1. The magnitude of Vinh may thus be equal to VDDSA_HI. The waveform BL(sel) shows that the selected bit lines are at a program enable level (Venable). In an embodiment, Venable is about 0V. With reference to FIG. 7, Venable may be equal to SRCGND apply to transistor 702. Between t0 and t1, the QPW bit lines are also at Venable. The waveforms 1102, BLX, BLC, and SL between t0 and t1 are applied during one embodiment of step 1004.

At t1, BLX and BLC drop to about 0V (e.g., Vss) and are maintained at 0V until t2. As a result all the bit lines will float between t1 and t2, as represented by the dashed lines for BL(ihn), BL(sel), and BL(QPW). Also at about t1, VDDSA is reduced to VDDSA_LOW. Reducing VDDSA at t1 is performed in one embodiment of step 1006. Also, at about t1 the source line voltage may be reduced to V_SL_PRG. In one embodiment, V_SL_PRG is about 1.8V. In one embodiment, the drop in SL at t1 is about the same as the drop in VDDSA at t1.

At t2, BLX and BLC are raised to VBLX_PROG and VBLC_PROG respectively. The magnitude of VBLC_PROG is less than VDDSA_LOW, but higher than V_QPW. For example, VBLC_PROG may be about 1.4V, VDDSA_LOW may be about 1.8V, and V_QPW may be about 0.5V to 0.7V. Between t2 and t7 the drain 312 of the BLC transistor 308 for sense amplifiers associated with inhibited bit lines may be at VDDSA_LOW. Also, the source 314 of the BLC transistor 308 for sense amplifiers associated with inhibited bit lines may be at about the voltage of the inhibited bit line. Between t2 and t3 the source 314 of the BLC transistor 308 for sense amplifiers associated with inhibited bit lines may thus be at about VDDSA_HI, which may be about 2.2V. Therefore, the inhibited bit lines will continue to float after t2. However, the selected bit lines and the QPW bit lines will no longer float after t2 due to the drain 312 of the BLC transistor 308 for sense amplifiers associated with selected bit lines and QPW bit lines being lower than BLC_PGM. For example, at t2 the drain 312 of the BLC transistor 308 for sense amplifiers associated with selected bit lines and QPW bit lines may be at 0V. At t3, the QPW bit lines are raised to V_QPW. The sense amplifiers 230 can be configured in a number of ways to provide V_QPW to the QPW bit lines. In one embodiment, the drain 312 of the BLC transistor 308 for sense amplifiers associated with QPW bit lines may be raised to V_QPW at t3. One technique is to change the voltage SRGGND at transistor 702 to V_QPW. Another technique is to use a different charging path in the sense amplifier (not depicted in FIG. 7) to provide V_QPW to the drain 312 of the BLC transistor 308 for sense amplifiers associated with QPW bit lines. Because the inhibited bit lines are floating after t2, the voltage on the inhibited bit lines could increase somewhat at t3 due to capacitive coupling between the inhibited bit lines and the QPW bit lines.

At t4, the voltages on the selected word line and the unselected word lines are raised to a boosting voltage (Vpass). At t5, the voltage on the selected word line is raised to a programming voltage (Vpgm). At t6 the voltages on the selected word line and the unselected word lines are reduced to, for example, 0V.

At t7, BLX and BLC are increased to VBLX_SNS and Vblc respectively in preparation for the verify (sensing) phase. During the verify phase, the BLC transistors 308 are operated in a source-follower mode in which the BLC transistors 308 will clamp the voltages on the bit lines to Vsense. An example of Vsense is about 0.5V. Also at t7, the source line voltage may be reduced to V_SL_SNS. An example of V_SL_SNS is about 0.5V. Also note that VDDSA remains at VDDSA_LOW during the verify phase. One factor in the ability to have VDDSA at VDDSA_LOW during the verify phase is the relatively low voltage on SL.

Also during the verify phase, the unselected word lines are raised to Vread at t8. Vread is sufficiently high to turn on all of the unselected memory cells. At t9, VWL_sel is increased to a compare voltage (Vcgr). With reference to FIG. 5B, Vcgr could be any of the verify reference voltages (VvA–VvG). In some embodiments, Vcgr will be increased one or more times such that more than one of the verify reference voltages may be tested. In one embodiment, XXL (see FIG. 7) is raised high between t9 and t10 to connect the sense node (SEN) to the bit line to sense the conduction current (if any) of the memory cell connected to the selected word line.

Recall that in one embodiment, each program loop the supply voltage is kept at the higher magnitude for the entire program phase and at the lower magnitude for the verify phase (see FIG. 9). The timing waveforms in FIG. 11 may be modified slightly to accommodate such an embodiment. In an embodiment, VDDSA 1102 is maintained at VDD-SA_HI until t7, at which point it is lowered to VDDSA_ LOW for the verify phase.

Figure 12:
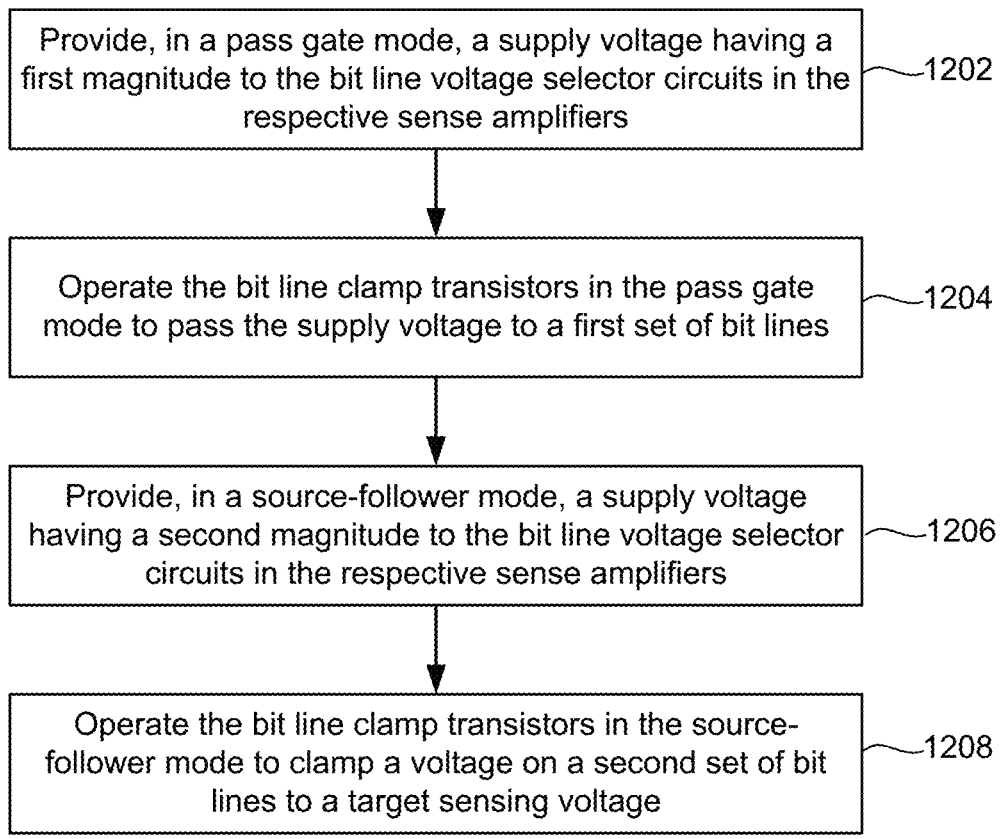
FIG. 12 is a flowchart of one embodiment of a process of dynamically adjusting a supply voltage to a sense amplifier when operating a BLC transistor in different modes.

In one embodiment, the magnitude of a supply voltage to the sense amplifiers 230 depends on whether the BLC transistors 308 are operated in a pass-gate mode or a source-follower mode. FIG. 12 is a flowchart of one embodiment of a process 1200 of dynamically adjusting a supply voltage to a sense amplifier when operating a BLC transistor in different modes. Step 1202 includes providing, in a pass-gate mode, a supply voltage (e.g., VDDSA) having a first magnitude to the bit line voltage selector circuits 316 in the respective sense amplifiers 230. Herein, a "pass-gate mode" refers to a mode in which the BLC transistors 308 are operated as pass gates in which a voltage at the respective drains 308 are passed to the respective bit lines.

Step 1204 includes operating the bit line clamp transistors 308 in the pass-gate mode to pass the supply voltage to a set of the bit lines while the supply voltage is at the first magnitude. In one embodiment, the set of the bit lines are inhibited bit lines. In one embodiment, steps 1202 and 1204 are performed during a program operation. In one embodiment, steps 1202 and 1204 are performed during an inhibited bit line charging phase of a program operation.

Step 1206 includes providing, in a source-follower mode, a supply voltage (e.g., VDDSA) having a second magnitude to the bit line voltage selector circuits 316 in the respective sense amplifiers 230. The second magnitude is less than the first magnitude. For example, the first magnitude may be about 2.2V and the second magnitude may be about 1.8V. Herein, a "source-follower mode" refers to a mode in which the BLC transistors 308 are operated as source-followers.

Step 1208 includes operating the bit line clamp transistors 308 in the source-follower mode to clamp a voltage on a second set of bit lines to a target sensing voltage while the supply voltage is at the second magnitude. In an embodiment, the second set of bit lines includes all of the bit lines in the first set, and may include additional bit lines. In an embodiment, steps 1206 and 1208 are performed during a verify operation. In an embodiment, steps 1206 and 1208 are performed during a read operation.

In view of the foregoing, a first embodiment includes an apparatus, comprising one or more control circuits and a plurality of sense amplifiers. The one or more control circuits are configured to connect to a memory structure comprising non-volatile memory cells and bit lines. The memory cells are arranged as NAND strings. Each NAND string is associated with a bit line. Each sense amplifier has a bit line voltage control circuit configured to control a voltage on a bit line associated with the sense amplifier. Each bit line voltage control circuit is configured to configured to receive a supply voltage that provides operating power to the bit line voltage control circuit. The one or more control circuits are in communication with the plurality of sense amplifiers. The one or more control circuits are configured to provide a supply voltage having a first magnitude to the bit line voltage control circuits of the respective sense amplifiers. The one or more control circuits are configured to perform an inhibited bit line charging phase of a program operation with the supply voltage at the first magnitude. The one or more control circuits are configured to reduce the supply voltage provided to the bit line voltage control circuit after the inhibited bit line charging phase to a second magnitude that is lower than the first magnitude. The one or more control circuits are configured to perform a verify phase of the program operation with the supply voltage at the second magnitude.

In a second embodiment, in furtherance to the first embodiment, the one or more control circuits are configured to perform an entire program phase of a loop of the program operation with the supply voltage provided to the bit line voltage control circuits at the first magnitude. The one or more control circuits are configured to reduce the supply voltage provided to the bit line voltage control circuits to the second magnitude after the program phase of the loop but prior to the verify phase of the loop.

In a third embodiment, in furtherance to the second embodiment, the one or more control circuits are configured to apply a program voltage to a selected word line in the memory structure during a loop of a programming phase of the program operation. The one or more control circuits are configured to reduce the supply voltage provided to the bit line voltage control circuits to the second magnitude after the inhibited bit line charging phase of the loop but prior to the programming phase of the loop of the program operation.

In a fourth embodiment, in furtherance to any of the first to third embodiments, each respective bit line voltage control circuit comprises a series connection of transistors that form a bit line charging path. The series connection of transistors includes a bit line clamp transistor having a source configured to connect to the bit line associated with the respective sense amplifier. The bit line clamp transistor has a drain. The series connection of transistors includes a supply voltage transistor having a drain configured to receive the supply voltage.

In a fifth embodiment, in furtherance any of the fourth embodiment, the one or more control circuits are configured to control the supply voltage transistors in sense amplifiers associated with bit lines to be inhibited from programming to provide the supply voltage having the first magnitude to the drains of the bit line clamp transistors associated with the inhibited bit lines. The one or more control circuits are configured to operate the bit line clamp transistors associated with the inhibited bit lines in a pass gate mode during the inhibited bit line charging phase of the program operation to pass the supply voltage having the first magnitude to the inhibited bit lines.

In a sixth embodiment, in furtherance to any of the fifth embodiment, the one or more control circuits are configured to apply a program pulse to a selected word line during a programming phase of the programming operation. The one or more control circuits are configured to operate the bit line clamp transistors to cut off the inhibited bit lines from the respective sense amplifiers to float the inhibited bit lines after charging the inhibited bit lines to the supply voltage having the first magnitude. The one or more control circuits are configured to reduce the supply voltage provided to the bit line voltage control circuits to the second magnitude after cutting off the inhibited bit lines but prior to the programming phase of the program operation.

In a seventh embodiment, in furtherance to any of the fourth to sixth embodiments, the one or more control circuits are configured to operate the bit line clamp transistors in a source-follower mode during the verify phase of the program operation to clamp the bit lines at a target voltage.

In an eighth embodiment, in furtherance to any of the fourth to seventh embodiments, the one or more control circuits are configured to apply a voltage to a source line during the verify phase. The one or more control circuits are configured to apply a control voltage to control gates of the respective bit line clamp transistors during the verify phase to clamp the bit lines at the target voltage, wherein the target voltage depends on a difference between the control voltage and the source line voltage, wherein the second magnitude is greater than the control voltage.

In a ninth embodiment, in furtherance to the any of the first to eighth embodiments, the first magnitude is sufficiently high to keep drain side select gates of inhibited NAND strings off to isolate channels of the inhibited NAND strings from inhibited bit lines during a programming phase of the program operation. The second magnitude is sufficiently high relative to a gate voltage of bit line clamp transistors in the respective bit line voltage control circuits to operate the bit line clamp transistors in a source-follower mode to clamp the bit lines at a target sensing voltage during the verify phase.

In a tenth embodiment, in furtherance to any of the first to the ninth embodiments, the apparatus further includes a first semiconductor die comprising the memory structure and a second semiconductor die comprising the sense amplifiers and the one or more control circuits.

In an eleventh embodiment, in furtherance to any of the first to tenth embodiments, the apparatus further includes a semiconductor die comprising the memory structure, the sense amplifiers, and the one or more control circuits.

One embodiment includes a method for controlling bit line voltages in a memory structure. The method includes applying a supply voltage to a drain of a first transistor in respective sense amplifiers during a program phase of a program operation. The first transistor in each respective sense amplifier is part of a series connection of transistors that includes a second transistor having a source connected to a bit line associated with the respective sense amplifier. The method includes issuing control signals to the series connection of transistors to pass the supply voltage to inhibited bit lines during the program phase, wherein the supply voltage has a first magnitude when the supply voltage is passed to the inhibited bit lines. The method includes lowering the magnitude of the supply voltage applied to the drains of the first transistors from the first magnitude to a second magnitude after the supply voltage is passed to the inhibited bit lines. The method includes issuing control signals to the series connection of transistors to clamp a voltage on the bit lines to a target voltage while continuing to apply the supply voltage to the drain of the first transistors at the second magnitude. The method includes sensing memory cells in the memory structure while the bit lines are clamped at the target voltage.

One embodiment includes a non-volatile storage device comprising a memory structure comprising a three-dimensional NAND array and a plurality of bit lines; a voltage source configured to provide a supply voltage having a first magnitude and a second magnitude that is lower than the first magnitude; a plurality of sense amplifiers; and one or more control circuits in communication with the memory structure, the voltage source, and the plurality of sense amplifiers. Each sense amplifier is associated with one of the plurality of bit lines. Each sense amplifier has a bit line clamp transistor having a drain and having a source connected to a bit line. Each sense amplifier has a bit line voltage selector circuit connected to the drain of the bit line clamp transistor. The bit line voltage selector circuit is configured to receive the supply voltage from the voltage source and to provide a drain voltage to the drain of the bit line clamp transistor. The one or more control circuits provide, in a pass-gate mode, a supply voltage having the first magnitude to the bit line voltage selector circuits in the respective sense amplifiers. The one or more control circuits operate the bit line clamp transistors in the pass-gate mode to pass the supply voltage to a first set of the bit lines while the supply voltage is at the first magnitude. The one or more control circuits provide, in a source-follower mode, a supply voltage having the second magnitude to the bit line voltage selector circuits in the respective sense amplifiers. The one or more control circuits operate the bit line clamp transistors in the source-follower mode to clamp a voltage on a second set of the bit lines to a target sensing voltage while the supply voltage is at the second magnitude.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a memory structure comprising non-volatile memory cells and bit lines, the memory cells arranged as NAND strings, each NAND string associated with a bit line; and
   a plurality of sense amplifiers, each sense amplifier having a bit line voltage control circuit configured to control a voltage on a bit line associated with the sense amplifier, each bit line voltage control circuit configured to configured to receive a supply voltage that provides operating power to the bit line voltage control circuit;

wherein the one or more control circuits are in communication with the plurality of sense amplifiers, wherein the one or more control circuits are configured to:
provide a supply voltage having a first magnitude to the bit line voltage control circuits of the respective sense amplifiers;
perform an inhibited bit line charging phase of a program operation with the supply voltage at the first magnitude;
reduce the supply voltage provided to the bit line voltage control circuit after the inhibited bit line charging phase to a second magnitude that is lower than the first magnitude; and
perform a verify phase of the program operation with the supply voltage at the second magnitude.

2. The apparatus of claim 1, wherein the one or more control circuits are configured to:
perform an entire program phase of a loop of the program operation with the supply voltage provided to the bit line voltage control circuits at the first magnitude; and
reduce the supply voltage provided to the bit line voltage control circuits to the second magnitude after the program phase of the loop but prior to the verify phase of the loop.

3. The apparatus of claim 1, wherein the one or more control circuits are configured to:
apply a program voltage to a selected word line in the memory structure during a loop of a programming phase of the program operation; and
reduce the supply voltage provided to the bit line voltage control circuits to the second magnitude after the inhibited bit line charging phase of the loop but prior to the programming phase of the loop of the program operation.

4. The apparatus of claim 1, wherein each respective bit line voltage control circuit comprises a series connection of transistors that form a bit line charging path, wherein the series connection of transistors includes:
a bit line clamp transistor having a source configured to connect to the bit line associated with the respective sense amplifier, the bit line clamp transistor having a drain; and
a supply voltage transistor having a drain configured to receive the supply voltage.

5. The apparatus of claim 4, wherein the one or more control circuits are configured to:
control the supply voltage transistors in sense amplifiers associated with bit lines to be inhibited from programming to provide the supply voltage having the first magnitude to the drains of the bit line clamp transistors associated with the inhibited bit lines; and
operate the bit line clamp transistors associated with the inhibited bit lines in a pass gate mode during the inhibited bit line charging phase of the program operation to pass the supply voltage having the first magnitude to the inhibited bit lines.

6. The apparatus of claim 5, wherein the one or more control circuits are configured to:
apply a program pulse to a selected word line during a programming phase of the programming operation;
operate the bit line clamp transistors to cut off the inhibited bit lines from the respective sense amplifiers to float the inhibited bit lines after charging the inhibited bit lines to the supply voltage having the first magnitude; and
reduce the supply voltage provided to the bit line voltage control circuits to the second magnitude after cutting off the inhibited bit lines but prior to the programming phase of the program operation.

7. The apparatus of claim 4, wherein the one or more control circuits are configured to:
operate the bit line clamp transistors in a source-follower mode during the verify phase of the program operation to clamp the bit lines at a target voltage.

8. The apparatus of claim 7, wherein the one or more control circuits are configured to:
apply a voltage to a source line during the verify phase; and
apply a control voltage to control gates of the respective bit line clamp transistors during the verify phase to clamp the bit lines at the target voltage, wherein the target voltage depends on a difference between the control voltage and the source line voltage, wherein the second magnitude is greater than the control voltage.

9. The apparatus of claim 1, wherein:
the first magnitude is sufficiently high to keep drain side select gates of inhibited NAND strings off to isolate channels of the inhibited NAND strings from inhibited bit lines during a programming phase of the program operation; and
the second magnitude is sufficiently high relative to a gate voltage of bit line clamp transistors in the respective bit line voltage control circuits to operate the bit line clamp transistors in a source-follower mode to clamp the bit lines at a target sensing voltage during the verify phase.

10. The apparatus of claim 1, further comprising:
a first semiconductor die comprising the memory structure; and
a second semiconductor die comprising the sense amplifiers and the one or more control circuits.

11. The apparatus of claim 1, further comprising:
a semiconductor die comprising the memory structure, the sense amplifiers, and the one or more control circuits.

12. A method for controlling bit line voltages in a memory structure, the method comprising:
applying a supply voltage to a drain of a first transistor in respective sense amplifiers during a program phase of a program operation, the first transistor in each respective sense amplifier is part of a series connection of transistors that includes a second transistor having a source connected to a bit line associated with the respective sense amplifier;
issuing control signals to the series connection of transistors to pass the supply voltage to inhibited bit lines during the program phase, wherein the supply voltage has a first magnitude when the supply voltage is passed to the inhibited bit lines;
lowering the magnitude of the supply voltage applied to the drains of the first transistors from the first magnitude to a second magnitude after the supply voltage is passed to the inhibited bit lines;
issuing control signals to the series connection of transistors to clamp a voltage on the bit lines to a target voltage while continuing to apply the supply voltage to the drain of the first transistors at the second magnitude; and
sensing memory cells in the memory structure while the bit lines are clamped at the target voltage.

13. The method of claim 12, wherein lowering the magnitude of the supply voltage applied to the drains of the first transistors from the first magnitude to the second magnitude after the supply voltage is passed to the inhibited bit lines comprises:

lowering the magnitude of the supply voltage after applying a program pulse to the memory cells during a loop of the program operation but prior to a verify of the loop of the program operation.

14. The method of claim 12, wherein lowering the magnitude of the supply voltage applied to the drains of the first transistors from the first magnitude to the second magnitude after the supply voltage is passed to the inhibited bit lines comprises:
lowering the magnitude of the supply voltage after passing the supply voltage to the inhibited bit lines during a loop of the program operation but prior to applying a program pulse to the memory cells for the loop of the program operation.

15. The method of claim 12, wherein:
issuing control signals to the series connection of transistors to pass the supply voltage to inhibited bit lines during the program phase includes operating the second transistors in a pass-gate mode; and
issuing control signals to the series connection of transistors to clamp a voltage on the bit lines to the target voltage includes operating the second transistors in a source-follower mode.

16. A non-volatile storage system, the system comprising:
a memory structure comprising a three-dimensional NAND array and a plurality of bit lines;
a voltage source configured to provide a supply voltage having a first magnitude and a second magnitude that is lower than the first magnitude;
a plurality of sense amplifiers, each sense amplifier associated with one of the plurality of bit lines, each sense amplifier having a bit line clamp transistor having a drain and having a source connected to a bit line, each sense amplifier having a bit line voltage selector circuit connected to the drain of the bit line clamp transistor, wherein the bit line voltage selector circuit is configured to receive the supply voltage from the voltage source and to provide a drain voltage to the drain of the bit line clamp transistor; and
one or more control circuits in communication with the memory structure, the voltage source, and the plurality of sense amplifiers, wherein the one or more control circuits:
provide, in a pass-gate mode, a supply voltage having the first magnitude to the bit line voltage selector circuits in the respective sense amplifiers;
operate the bit line clamp transistors in the pass-gate mode to pass the supply voltage to a first set of the bit lines while the supply voltage is at the first magnitude;
provide, in a source-follower mode, a supply voltage having the second magnitude to the bit line voltage selector circuits in the respective sense amplifiers; and
operate the bit line clamp transistors in the source-follower mode to clamp a voltage on a second set of the bit lines to a target sensing voltage while the supply voltage is at the second magnitude.

17. The non-volatile storage system of claim 16, wherein the one or more control circuits:
apply a program voltage to a selected word line in the memory structure during a loop of a programming phase of a program operation;
operate the bit line clamp transistors in the pass-gate mode to pass the supply voltage to inhibited bit lines during an inhibited bit line charging phase of a loop of a program operation while the supply voltage is at the first magnitude; and
reduce the supply voltage provided to the bit line voltage selector circuits in the respective sense amplifiers to the second magnitude after of the inhibited bit line charging phase of the loop but prior to the programming phase of the loop of the program operation.

18. The non-volatile storage system of claim 16, wherein the one or more control circuits:
operate the bit line clamp transistors in the pass-gate mode to pass the supply voltage to inhibited bit lines during an inhibited bit line charging phase of a loop of a program operation while the supply voltage is at the first magnitude;
apply a program voltage to a selected word line in the memory structure during the loop of a programming phase of the program operation while the supply voltage remains at the first magnitude;
reduce the supply voltage provided to the bit line voltage selector circuits in the respective sense amplifiers to the second magnitude after of the programming phase of the loop but prior to a verify phase of the loop of the program operation; and
operate the bit line clamp transistors in the source-follower mode to clamp the voltage on the bit lines to the target sensing voltage while the supply voltage is at the second magnitude during the verify phase of the loop of the program operation.

19. The non-volatile storage system of claim 16, wherein:
the first magnitude is sufficiently high to keep drain side select gates of inhibited NAND strings off to isolate channels of the inhibited NAND strings from inhibited bit lines during a programming phase of a program operation; and
the second magnitude is sufficiently high to operate the bit line clamp transistors in a source-follower mode to clamp the bit lines at a target sensing voltage during a sensing operation.

20. The non-volatile storage system of claim 16, wherein the one or more control circuits:
apply a voltage to a source line in the source-follower mode; and
apply a control voltage to control gates of the respective bit line clamp transistors in the source-follower mode to clamp the bit lines at the target sensing voltage, wherein the target sensing voltage depends on a difference between the control voltage and the source line voltage, wherein the second magnitude is greater than the control voltage.

* * * * *